US012345995B2

(12) United States Patent
Visani

(10) Patent No.: US 12,345,995 B2
(45) Date of Patent: *Jul. 1, 2025

(54) LAYERED STRUCTURE WITH HIGH DIELECTRIC CONSTANT FOR USE WITH ACTIVE MATRIX BACKPLANES

(71) Applicant: Nuclera LTD, Cambridge (GB)

(72) Inventor: Cristina Visani, Cambridge, MA (US)

( * ) Notice: Subject to any disclaimer, the term of this patent is extended or adjusted under 35 U.S.C. 154(b) by 65 days.

This patent is subject to a terminal disclaimer.

(21) Appl. No.: 18/428,968

(22) Filed: Jan. 31, 2024

(65) Prior Publication Data

US 2024/0201556 A1    Jun. 20, 2024

Related U.S. Application Data

(60) Continuation of application No. 17/887,988, filed on Aug. 15, 2022, now Pat. No. 11,921,394, which is a division of application No. 16/862,750, filed on Apr. 30, 2020, now Pat. No. 11,675,244.

(60) Provisional application No. 62/843,082, filed on May 3, 2019.

(51) Int. Cl.
G02F 1/16756 (2019.01)
G02F 1/1368 (2006.01)
G02F 1/167 (2019.01)
G02F 1/1675 (2019.01)
G02F 1/1676 (2019.01)

(52) U.S. Cl.
CPC ........ G02F 1/16756 (2019.01); G02F 1/1368 (2013.01); G02F 1/167 (2013.01); G02F 1/1676 (2019.01); G02F 2001/1678 (2013.01)

(58) Field of Classification Search
CPC .. G02F 1/16756; G02F 1/1676; G02F 1/1368; G02F 1/167
See application file for complete search history.

(56) References Cited

U.S. PATENT DOCUMENTS

| | | |
|---|---|---|
| 5,189,503 A | 2/1993 | Suguro et al. |
| 6,259,498 B1 | 7/2001 | Takeda |
| 6,383,642 B1 | 5/2002 | Le Bellac et al. |
| 6,504,524 B1 | 1/2003 | Gates et al. |
| 6,531,997 B1 | 3/2003 | Gates et al. |
| 6,627,503 B2 | 9/2003 | Ma et al. |
| 6,724,519 B1 | 4/2004 | Comiskey et al. |

(Continued)

FOREIGN PATENT DOCUMENTS

| | | |
|---|---|---|
| CN | 108519710 A | 9/2018 |
| KR | 10-2009-0125966 A | 12/2009 |
| WO | 2019/079267 A1 | 4/2019 |

OTHER PUBLICATIONS

Choi et al., Digital microfluidics. Annu Rev Anal Chem (Palo Alto Calif). 2012;5:413-40.

(Continued)

*Primary Examiner* — Lucy P Chien
(74) *Attorney, Agent, or Firm* — McCarter & English, LLP

(57) ABSTRACT

Layered dielectric materials for use in controlling dielectric strength in microelectronic devices, especially as they relate to electrophoretic and electrowetting applications. Specifically, a combination of a first atomic layer deposition (ALD) step, a sputtering step, and a second ALD step result in a layer that is chemically robust and nearly pinhole free. The dielectric layer may be disposed on the transparent common electrode of an electrophoretic display or covering the pixelated backplane electrodes, or both.

19 Claims, 21 Drawing Sheets

(56) References Cited

U.S. PATENT DOCUMENTS

| | | |
|---|---|---|
| 6,922,276 B2 | 7/2005 | Zhang et al. |
| 7,002,728 B2 | 2/2006 | Pullen et al. |
| 7,072,095 B2 | 7/2006 | Liang et al. |
| 7,116,318 B2 | 10/2006 | Amundson et al. |
| 7,119,772 B2 | 10/2006 | Amundson et al. |
| 7,170,670 B2 | 1/2007 | Webber |
| 7,379,033 B2 | 5/2008 | Lee et al. |
| 7,560,395 B2 | 7/2009 | Ahn et al. |
| 7,715,088 B2 | 5/2010 | Liang et al. |
| 7,839,564 B2 | 11/2010 | Whitesides et al. |
| 7,903,322 B2 | 3/2011 | Fang et al. |
| 9,170,468 B2 | 10/2015 | Lin et al. |
| 9,697,778 B2 | 7/2017 | Telfer et al. |
| 9,714,463 B2 | 7/2017 | White et al. |
| 9,726,957 B2 | 8/2017 | Telfer et al. |
| 9,921,435 B2 | 3/2018 | Tateno |
| 9,921,451 B2 | 3/2018 | Telfer et al. |
| 9,922,603 B2 | 3/2018 | Lin |
| 10,032,419 B2 | 7/2018 | Lin et al. |
| 10,276,109 B2 | 4/2019 | Crounse et al. |
| 10,303,032 B2 | 5/2019 | Brossard et al. |
| 10,453,854 B2 | 10/2019 | Kanno et al. |
| 10,475,396 B2 | 11/2019 | Sim et al. |
| 10,600,918 B2 | 3/2020 | Tanaka et al. |
| 11,030,936 B2 | 6/2021 | Emelie et al. |
| 2001/0054605 A1 | 12/2001 | Suzuki et al. |
| 2004/0121566 A1 | 6/2004 | Laibowitz et al. |
| 2004/0266109 A1 | 12/2004 | Ogura et al. |
| 2005/0116887 A1 | 6/2005 | Lee et al. |
| 2007/0278493 A1 | 12/2007 | Sato |
| 2009/0296314 A1 | 12/2009 | Yang |
| 2014/0340735 A1 | 11/2014 | Lin et al. |
| 2015/0084044 A1 | 3/2015 | Tanaka et al. |
| 2017/0090254 A1 | 3/2017 | Tateno |
| 2017/0148372 A1 | 5/2017 | Emelie et al. |
| 2017/0271383 A1 | 9/2017 | Lai et al. |
| 2017/0316953 A1 | 11/2017 | Zhang et al. |
| 2017/0322473 A1 | 11/2017 | Brossard et al. |
| 2018/0116045 A1 | 4/2018 | Kostamo et al. |
| 2018/0158850 A1 | 6/2018 | Wu et al. |
| 2020/0348576 A1 | 11/2020 | Visani et al. |
| 2022/0390806 A1 | 12/2022 | Visani |

OTHER PUBLICATIONS

Johnson et al., A brief review of atomic layer deposition: from fundamentals to applications. Materials Today. Jun. 2014;17(5):236-46.

Kelly et al., Magnetron sputtering: a review of recent developments and applications. Vacuum. Mar. 2000;56(3):159-72.

European Office Action for Application No. 21206242.6, dated Apr. 5, 2022, 7 pages.

International Search Report and Written Opinion for Application No. PCT/US2020/030604, dated Aug. 6, 2020, 12 pages.

Japanese Office Action for Application No. 2021-178644, dated Nov. 10, 2022, 8 pages.

Korean Office Action for Application No. 10-2021-7034448, dated Aug. 14, 2023, 10 pages.

LAYERED STRUCTURE WITH HIGH DIELECTRIC CONSTANT FOR USE WITH ACTIVE MATRIX BACKPLANES

RELATED APPLICATIONS

This application is a continuation of U.S. application Ser. No. 17/887,988 filed Aug. 15, 2022, which is a divisional of U.S. patent application Ser. No. 16/862,750, filed Apr. 30, 2020 (published as US 2020/0348576), which claims priority to U.S. Provisional Application No. 62/843,082, filed May 3, 2019. All patents and patent applications referenced in this specification are incorporated by reference in their entireties.

BACKGROUND

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. Typically, one electrode layer has the form of a single continuous electrode and the other electrode layer is patterned into a matrix of pixel electrodes, each of which defines one pixel of the display. In an example, the electrophoretic medium is encapsulated in microcapsules, and the microcapsules are dispersed in a binder that is coated on to a flexible substrate comprising indium-tin-oxide (ITO) or a similar conductive coating (which acts as one electrode of the final display) on a plastic film (release), the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive.

The lamination adhesive(s) and the binder are engineered to have specific conductivities so that the electrophoretic particles behave predictably. For example, in a black and white electrophoretic display, when the display is addressed to achieve a particular gray state, the gray state should not drift in measured reflectivity over time. However, in reality, the layered stacks act as capacitors and the optical states drift slightly as the stored electrical energy discharges from the display stack. Such variances are often not perceptible in a black and white eReader, but for advanced applications, such as full color electrophoretic displays using dithered colors, the perceived image can vary noticeably due to capacitive discharge. As the colored pigments shift with capacitive decay, flesh tones, for example, can take on a green hue, which is immediately noticeable to many viewers. To avoid such limitations, it would be beneficial to have better tools to control the dielectric capacitance in the stack of electrophoretic materials. A further benefit would be to reduce electrochemical reactions between conductive materials, such as pixel electrodes, and trace materials, such as salts that can be introduced into the adhesive layers or electrophoretic media during fabrication.

The electric fields experienced by an electrophoretic fluid in an electrophoretic display depend upon the driving waveform and the capacitances of (a) the various layers comprising the display and, more importantly, (b) the capacitances of the interfaces between these layers. When the display is grounded after having been driven, the charge stored in these capacitors is drained with a time constant that depends upon the capacitance and the resistance through which the return current flows. If this time constant is too short, overly rapid discharge can cause motion of the charged pigments in the opposite direction to that in which they were originally driven. This phenomenon is referred to as "optical kickback." It would be preferred to engineer the capacitance of the various layers and interfaces in the display, particularly the interface between the ionically-conductive layers of the display and at least one of the driving electrodes, so as to be able to control this time constant.

One solution to overcome optical kickback it to drive the electrophoretic fluid with so-called "DC balanced" waveforms. As discussed in U.S. Pat. Nos. 6,531,997 and 6,504,524, problems may be encountered, and the working lifetime of a display reduced, if the method used to drive the display does not result in zero, or near zero, net time-averaged applied electric field across the electro-optic medium. A drive method which does result in zero net time-averaged applied electric field across the electro-optic medium is conveniently referred to a "direct current balanced" or "DC balanced". Driving waveforms that are not DC balanced are typically referred to as "DC unbalanced." Most electrophoretic displays are designed to operate with DC balanced waveforms because of concerns about operating lifetime and optical effects such as kickback.

In addition to electrophoretic displays, controlling dielectric capacitance is also important in electrowetting displays and electrowetting applications such as digital microfluidics, alternatively referred to as electrowetting on dielectric, or "EWoD." EWoD techniques allows sample preparation, assays, and synthetic chemistry to be performed with tiny quantities of both samples and reagents. (A 2012 review of the electrowetting technology was provided by Wheeler in "Digital Microfluidics," *Annu. Rev. Anal. Chem.* 2012, 5:413-40, which is incorporated herein by reference in its entirety.) Such EWoD devices may be constructed with segmented electrodes, whereby ten to twenty electrodes are directly driven with a voltage controller. Alternatively, EWoD devices may incorporate active matrix devices (a.k.a. active matrix EWoD, a.k.a. AM-EWoD) which include many thousands, hundreds of thousands, or even millions of addressable electrodes. In an active matrix, the electrodes are typically controlled by thin-film transistors (TFTs) and droplet motion is computer programmable so that AM-EWoD arrays can be used as general purpose devices that allow great freedom for controlling multiple droplets and executing simultaneous analytical processes. In some instances, the electrodes of an EWoD system are coated with high-dielectric-constant materials, such as silicon nitride, to increase the local field strength at the pixels, thus facilitating greater droplet control.

SUMMARY OF INVENTION

This application discloses a preferred dielectric layer construction that can be used for a number of applications, including semiconductor electronics, electro-optic displays, and digital microfluidic devices. The described dielectric layer achieves a high dielectric constant with good surface smoothness, few pinholes, and reduced chemical reactivity.

In one instance the invention includes a layered dielectric comprising a first layer (a.k.a. barrier layer), a second layer (a.k.a. thick layer), and a third layer (a.k.a. capping layer), wherein the second layer is disposed between the first and third layers. The first layer includes aluminum oxide or hafnium oxide and has a thickness between 9 nm and 80 nm. The second layer includes tantalum oxide or hafnium oxide and has a thickness between 40 nm and 250 nm. The third layer tantalum oxide or hafnium oxide and has a thickness between 5 nm and 60 nm. In an embodiment, the first layer comprises $Al_2O_3$, the second layer comprises $HfO_2$, and the third layer comprises $Ta_2O_5$. In another embodiment, the first layer comprises $Al_2O_3$, the second layer comprises $Ta_2O_5$, and the third layer comprises $HfO_2$. Typically, the first layer is 20 to 40 nm thick, and/or the second layer is 100 to 150 nm thick, and/or the third layer is 10 to 35 nm thick. In some embodiments, the dielectric strength of the layered dielectric is greater than 6 MV/cm.

Dielectric layers of the invention can be deposited on a substrate, for example a substrate including a plurality of electrodes disposed between the substrate and the layered dielectric. In some embodiments, the electrodes are disposed in an array and each electrode is associated with a thin film transistor (TFT). In some embodiments, a hydrophobic layer is deposited on the third layer, i.e., on top of the dielectric stack. In some embodiments, the hydrophobic layer is a fluoropolymer, which can be between 10 and 50 nm thick, and deposited with spin-coating or another coating method.

Also described herein is a method for creating a layered dielectric of the type described above. The method includes providing a substrate, depositing a first layer using atomic layer deposition (ALD), depositing a second layer using sputtering, and depositing the third layer using ALD. (The first layer is deposited on the substrate, the second layer is deposited on the first layer, and the third layer is deposited on the second layer). The first ALD layer typically includes aluminum oxide or hafnium oxide and has a thickness between 9 nm and 80 nm. The second sputtered layer typically includes tantalum oxide or hafnium oxide and has a thickness between 40 nm and 250 nm. The third ALD layer typically includes tantalum oxide or hafnium oxide and has a thickness between 5 nm and 60 nm. In some embodiments, the atomic layer deposition comprises plasma-assisted atomic layer deposition. In some embodiments, the sputtering comprises radio-frequency magnetron sputtering. In some embodiments, the atomic layer deposition process includes introduction of $Al(CH_3)_3$, $Ta[(N(CH_3)_2)_3NC(CH_3)_3]$, or $Hf(N(CH_3)_2)_4$ and production of an oxygen plasma. In some embodiments, the ALD process is completed at a pressure of less than 1 Atmosphere. In some embodiments, the method further includes spin coating a hydrophobic material on the third layer.

The dielectric layers described herein may be used in electrophoretic displays to improve the longevity of the displays, e.g., by reducing electrochemical reactions between the adhesive components, binders, primers, or electrophoretic medium and the drive electrodes, e.g., an active matrix backplane, or the top electrode, e.g., a layer of PET-ITO. While intentionally including dielectric layers in an electrophoretic display typically causes decreased optical performance, it is found that acceptable optical performance can be achieved with regular active grounding of the electrodes between updates in a display driven with a DC-imbalanced waveform. The overall update time for a pixel in an image can be decreased because (a) the time spent on DC-balancing pulses is not required, and (b) DC-balancing pulses may bias the optical state of the display in the opposite direction from the intended color, requiring additional waveform time to overcome. DC-imbalanced waveforms lead to build-up of remnant voltage but this can be drained during post-drive grounding.

Such dielectric layers can be incorporated into electrophoretic displays, for example electrophoretic displays including a light-transmissive electrode, a dielectric layer, an electrophoretic layer, and a rear electrode. Typically, the electrophoretic layer will include a first set of light-scattering particles and two additional sets of particles having different optical characteristics from the first set of light-scattering particles. In some embodiments, dielectric layer is between 10 nm thick and 100 nm thick, i.e., between 25 nm thick and 75 nm thick. The dielectric layer may comprise aluminum oxide, hafnium oxide, tantalum oxide, or silicon nitride, and the dielectric layer may be formed by a combination of both atomic layer deposition and sputtering. In some embodiments, the electrophoretic display also comprises an adhesive layer. In some embodiments, the electrophoretic layer includes four sets of charged pigment particles. The four sets of charged particles may be dispersed in a non-polar solvent. The four sets of charged pigment particles may be white, cyan, magenta, and yellow in color, or white, black, red, and yellow in color, or white, blue, red, and yellow in color. In some embodiments, two of the sets of particles are positively charged and two of the sets of particles are negatively charged.

The invention additionally includes a method of driving an electrophoretic display with a DC-imbalanced waveform. The method includes providing an electrophoretic display, providing a voltage source, and driving the electrophoretic layer with a DC-imbalanced waveform that includes both a driving portion and a grounding portion. The electrophoretic display includes a light-transmissive electrode, a dielectric layer, an electrophoretic layer, and a rear electrode. In some embodiments, the driving portion is done during a first period, the grounding portion is done during a second period, and the second period is as long as the first period or longer. In some embodiments, the dielectric layer is between 10 nm thick and 100 nm thick, i.e., between 25 nm thick and 75 nm thick. The dielectric layer may include aluminum oxide, hafnium oxide, tantalum oxide, or silicon nitride. In some embodiments, the dielectric layer is formed using both atomic layer deposition and sputtering. In some embodiments, the electrophoretic display additionally includes an adhesive layer. In some embodiments, the electrophoretic layer includes at least two charged pigment particles dispersed in a nonpolar solvent, for example, the electrophoretic layer may include four charged pigment particles. In embodiments with four charged pigment particles, the particles may be white, cyan, magenta, and yellow, or white, black, red, and yellow, or white, blue, red, and yellow.

DETAILED DESCRIPTION

Figure 1A:
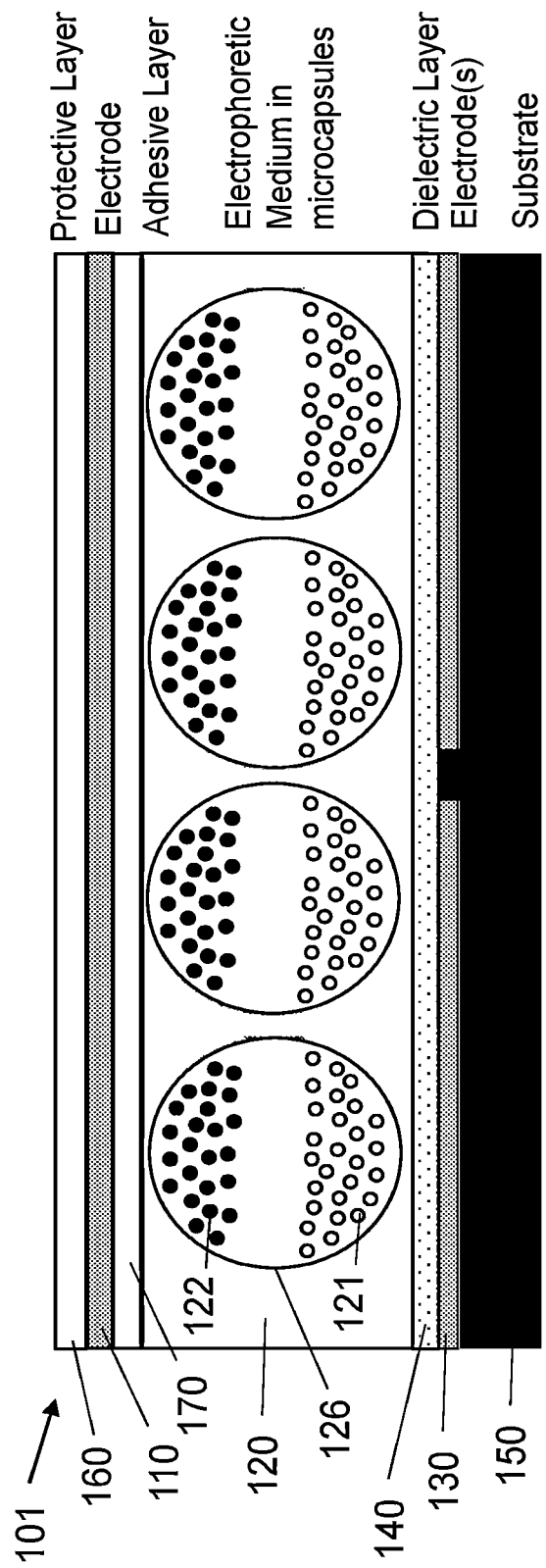
FIG. 1A illustrates the use of a dielectric layer with an encapsulated electrophoretic medium.
Figure 1B:
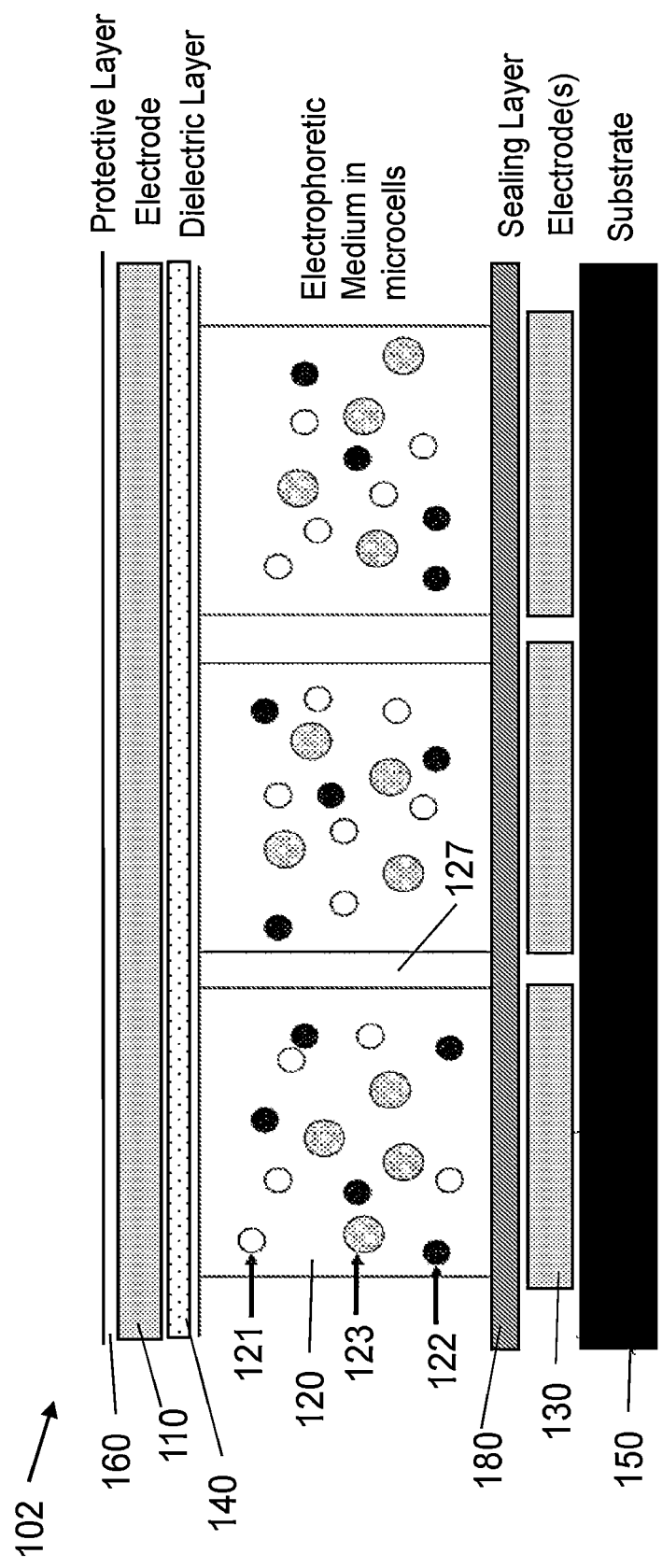
FIG. 1B illustrates the use of a dielectric layer with an electrophoretic medium contained in microcells.
Figure 1C:
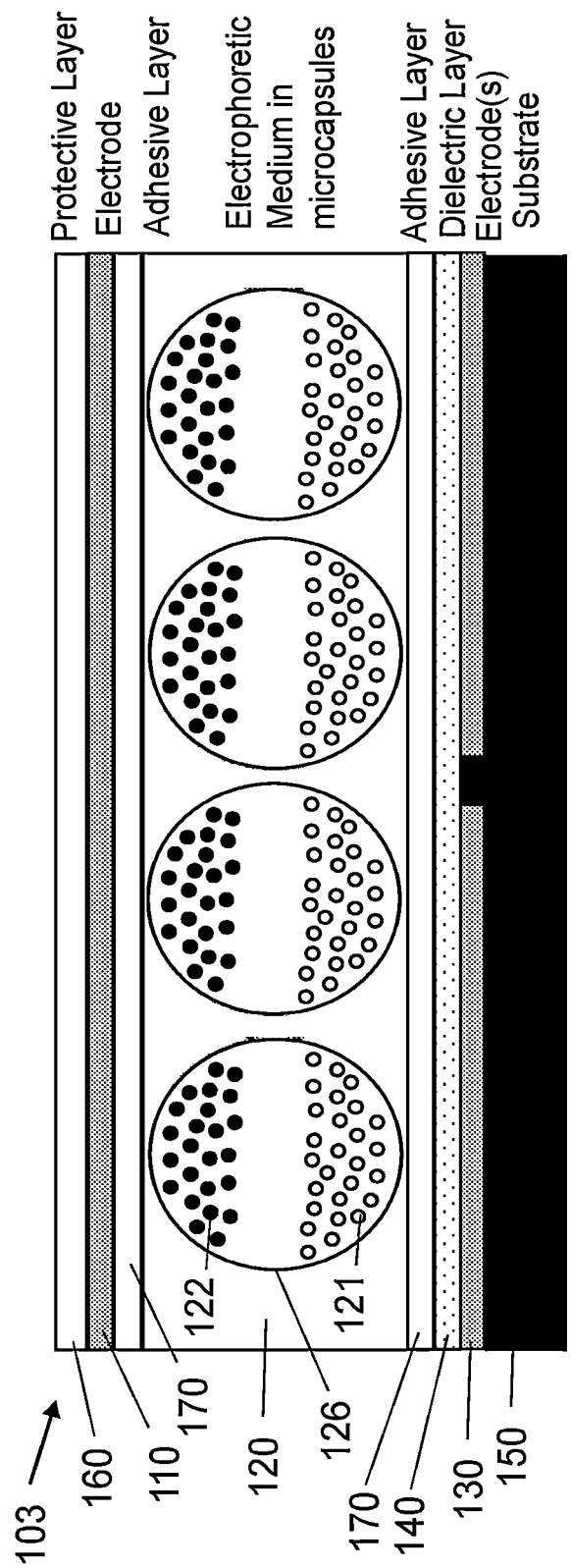
FIG. 1C illustrates the use of a dielectric layer with an encapsulated electrophoretic medium.
Figure 1D:
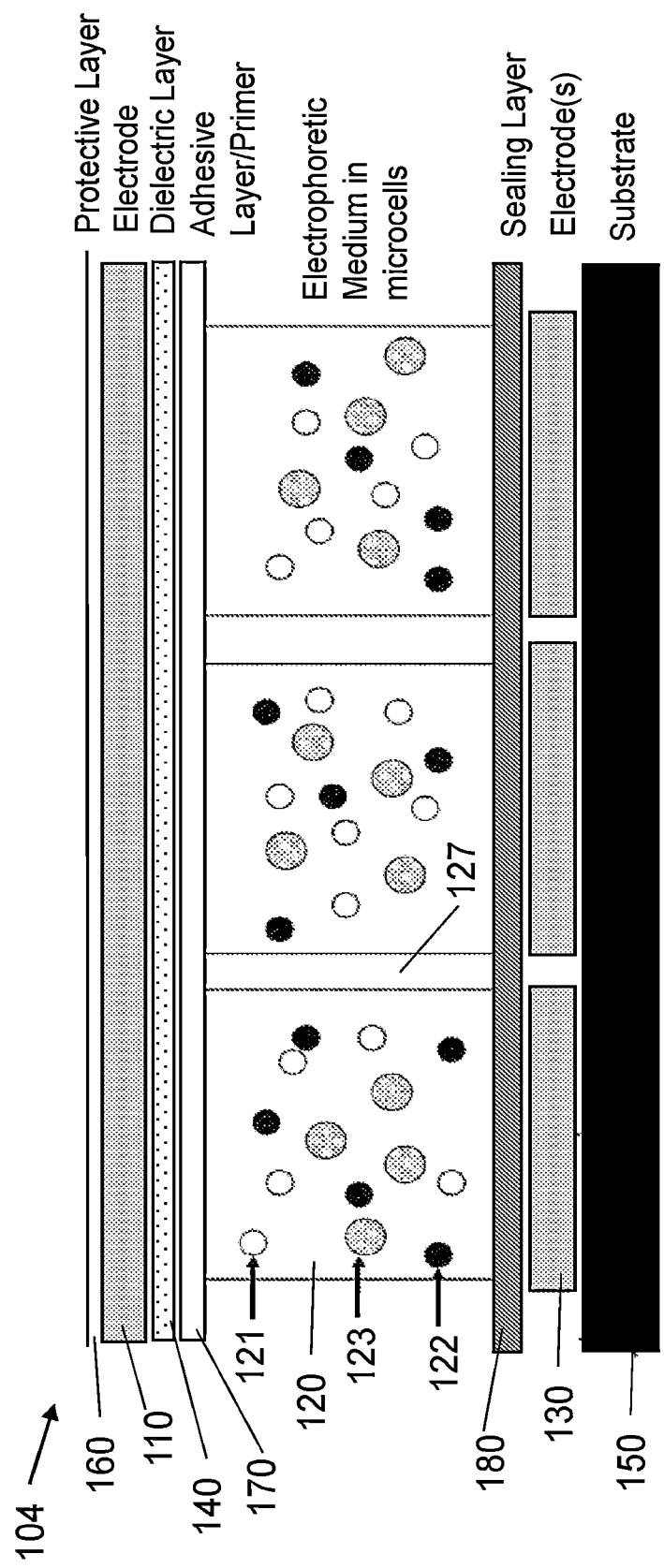
FIG. 1D illustrates the use of a dielectric layer with an electrophoretic medium contained in microcells.

This application details constructions and methods for creating a layered dielectric material with a high (greater than k=5) dielectric constant. The layered dielectric described herein is an excellent material for modifying the electric field interactions between, for example, an electrophoretic medium and the top and bottom electrode. Furthermore, because the layered dielectric has very few pinholes, there is less current leakage and less unwanted electrochemistry in the resulting device.

The benefits of high k dielectric materials are appreciated in the fields of materials science and electrical engineering. The dielectric constant, k, generally describes a material's ability to store electrical energy in an electric field. In general, as the dielectric constant of a material increases, the amount of an electric field that passes through that material lessens. Thus, high dielectric-constant materials are used to even out electric fields and prevent concentrated electric field gradients, which can, for example, cause unwanted electrical switching of electrical elements such as transistors. The continuity of a dielectric layer is quite important because variations in thickness or composition can create pathways for short circuits and breakdowns.

When used with an electrophoretic display, a dielectric layer is provided either covering the transparent common electrode of an electrophoretic display or covering the pixelated backplane electrodes, or both. The dielectric layer performs two functions. Firstly, it acts as a barrier to ion and electron transport. Reducing ion and electron transport results in reduced electrochemistry at the electrode interface and thereby mitigates degradation of the electrode material when the display is driven. Secondly, the dielectric layer, since it separates the display electrodes and the conductive display layers, provides a capacitive element that may be used to control the buildup and discharge of remnant voltages within the display. These two features are particularly important in displays that are driven with DC-imbalanced waveforms.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

Electrophoretic media used herein include charged particles that vary in color, reflective or absorptive properties, charge density, and mobility in an electric field (measured as a zeta potential). A particle that absorbs, scatters, or reflects light, either in a broad band or at selected wavelengths, is referred to herein as a colored or pigment particle. Various materials other than pigments (in the strict sense of that term as meaning insoluble colored materials) that absorb or reflect light, such as dyes or photonic crystals, etc., may also be used in the electrophoretic media and displays of the present invention. For example, the electrophoretic medium might include a fluid, a plurality of first and a plurality of second particles dispersed in the fluid, the first and second particles bearing charges of opposite polarity, the first particle being a light-scattering particle and the second particle having one of the subtractive primary colors, and a plurality of third and a plurality of fourth particles dispersed in the fluid, the third and fourth particles bearing charges of opposite polarity, the third and fourth particles each having a subtractive primary color different from each other and from the second particles, wherein the electric field required to separate an aggregate formed by the third and the fourth particles is greater than that required to separate an aggregate formed from any other two types of particles.

The electrophoretic media of the present invention may contain any of the additives used in prior art electrophoretic media as described for example in the E Ink and MIT patents and applications mentioned above. Thus, for example, the electrophoretic medium of the present invention will typically comprise at least one charge control agent to control the charge on the various particles, and the fluid may have dissolved or dispersed therein a polymer having a number average molecular weight in excess of about 20,000 and being essentially non-absorbing on the particles to improves the bistability of the display, as described in the aforementioned U.S. Pat. No. 7,170,670.

In one embodiment, the present invention uses a light-scattering particle, typically white, and three substantially non-light-scattering particles. There is of course no such thing as a completely light-scattering particle or a completely non-light-scattering particle, and the minimum degree of light scattering of the light-scattering particle, and the maximum tolerable degree of light scattering tolerable in the substantially non-light-scattering particles, used in the electrophoretic of the present invention may vary somewhat depending upon factors such as the exact pigments used, their colors and the ability of the user or application to tolerate some deviation from ideal desired colors. The scattering and absorption characteristics of a pigment may be assessed by measurement of the diffuse reflectance of a sample of the pigment dispersed in an appropriate matrix or liquid against white and dark backgrounds. Results from such measurements can be interpreted according to a number of models that are well-known in the art, for example, the one-dimensional Kubelka-Munk treatment. In the present invention, it is preferred that the white pigment exhibit a diffuse reflectance at 550 nm, measured over a black background, of at least 5% when the pigment is approximately isotropically distributed at 15% by volume in a layer of thickness 1 μm comprising the pigment and a liquid of refractive index less than 1.55. The yellow, magenta and cyan pigments preferably exhibit diffuse reflectances at 650, 650 and 450 nm, respectively, measured over a black background, of less than 2.5% under the same conditions. (The wavelengths chosen above for measurement of the yellow, magenta and cyan pigments correspond to spectral regions of minimal absorption by these pigments.) Colored pigments meeting these criteria are hereinafter referred to as "non-scattering" or "substantially non-light-scattering". Specific examples of suitable particles are disclosed in U.S. Pat. No. 9,921,451, which is incorporated by reference herein.

Alternative particle sets may also be used, including four sets of reflective particles, or one absorptive particle with three or four sets of different reflective particles, i.e., such as described in U.S. Pat. Nos. 9,922,603 and 10,032,419, which are incorporated by reference herein. For example, white particles may be formed from an inorganic pigment, such as $TiO_2$, $ZrO_2$, ZnO, $Al_2O_3$, $Sb_2O_3$, $BaSO_4$, $PbSO_4$ or the like, while black particles may be formed from CI pigment black 26 or 28 or the like (e.g., manganese ferrite black spinel or copper chromite black spinel) or carbon black. The third/fourth/fifth type of particles may be of a color such as red, green, blue, magenta, cyan or yellow. The pigments for this type of particles may include, but are not limited to, CI pigment PR 254, PR122, PR149, PG36, PG58, PG7, PB28, PB15:3, PY138, PY150, PY155 or PY20. Specific examples include Clariant Hostaperm Red D3G 70-EDS, Hostaperm Pink E-EDS, PV fast red D3G, Hostaperm red D3G 70, Hostaperm Blue B2G-EDS, Hostaperm Yellow H4G-EDS, Hostaperm Green GNX, BASF Irgazine red L 3630, Cinquasia Red L 4100 HD, and Irgazin Red L 3660 HD; Sun Chemical phthalocyanine blue, phthalocyanine green, diarylide yellow or diarylide AAOT yellow.

Typical electrophoretic displays are driven with impulse-balanced waveforms (aka DC-balanced waveforms), as described, for example, in U.S. Pat. No. 7,119,772. The purpose of impulse balancing is to limit the buildup of remnant voltages and to protect the display electrodes from electrochemical damage. However, providing DC balance can severely compromise the waveform, particularly in the case of color displays such as those disclosed, for example, in U.S. Pat. No. 10,276,109. As discussed in U.S. Pat. No. 10,276,109 with respect to FIG. 1, color display waveforms typically includes a first phase that provides DC-balance to the overall update waveform. That is, the first phase delivers a net impulse that is equal and opposite to the combined net impulse of the remainder of the waveform used to achieve the color transition needed for an image update. However, the color-rendering portions of the waveform must additionally overcome the state of the pigments induced by phase the first phase. As a result, the pigments don't begin the color update from a neutral state but rather are initially driving in an almost opposite direction from their desired final positions. As a result, the total waveform may be quite long (on the order of seconds).

To drive a multi-particle system, i.e., as described herein, driving methods typically include applying a voltage to first and second electrodes of a color electrophoretic display, with the first electrode forming the viewing surface of the display, the display having voltage control means capable of applying voltage differences of +VH, +VL, 0, −VL and −VH between the first and second electrodes respectively, where:

$$+V_H > +V_L > 0 > -V_L > -V_H$$

the driving methods may include, (a) displaying at the viewing surface alternately the color of the fourth particles, and the color of a mixture of the fourth and second particles and the by applying between the electrodes a series of first pulses of either $+V_H$ or $-V_H$ and of a polarity which drives the fourth particles towards the first electrode, said series of first pulses alternating with second pulses of $+V_L$ or $-V_L$, and of opposite polarity to, but greater duration than, the first pulses, and (b) displaying at the viewing surface alternately the color of the third particles and the color of a mixture of the third and second particles by applying between the electrodes a series of third pulses of either $+V_H$ or $-V_H$ and of a polarity which drives the third particles towards the first electrode, said series of third pulses alternating with fourth pulses of $+V_L$ or $-V_L$, and of opposite polarity to, but greater duration than, the third pulses.

The material from which the dielectric layer is made may be organic or inorganic. Preferably the material should be impermeable to ions and electrons and have a high dielectric strength (at least about 10 V/μm). The thickness of the dielectric layer will depend upon its dielectric constant, as discussed in more detail below. Examples of materials from which the dielectric layer may be made are silicon dioxide, silicon nitride, metal oxides such as zinc oxide, tantalum oxide, hafnium oxide, and the like, and organic materials such as parylene or other polymeric compounds. Combinations of more than one material may be used, and the dielectric layer may comprise more than one sublayer that may be of different materials.

As discussed above, the dielectric layer, in addition to blocking passage of electrochemical current through the display, will also act as a capacitor that can limit the buildup of remnant voltages when the display is driven. Furthermore, when coupled with the correct drive/grounding regime, an electrophoretic display can achieve much faster updates for color waveforms with only marginal loss in the overall color gamut.

Figure 1E:
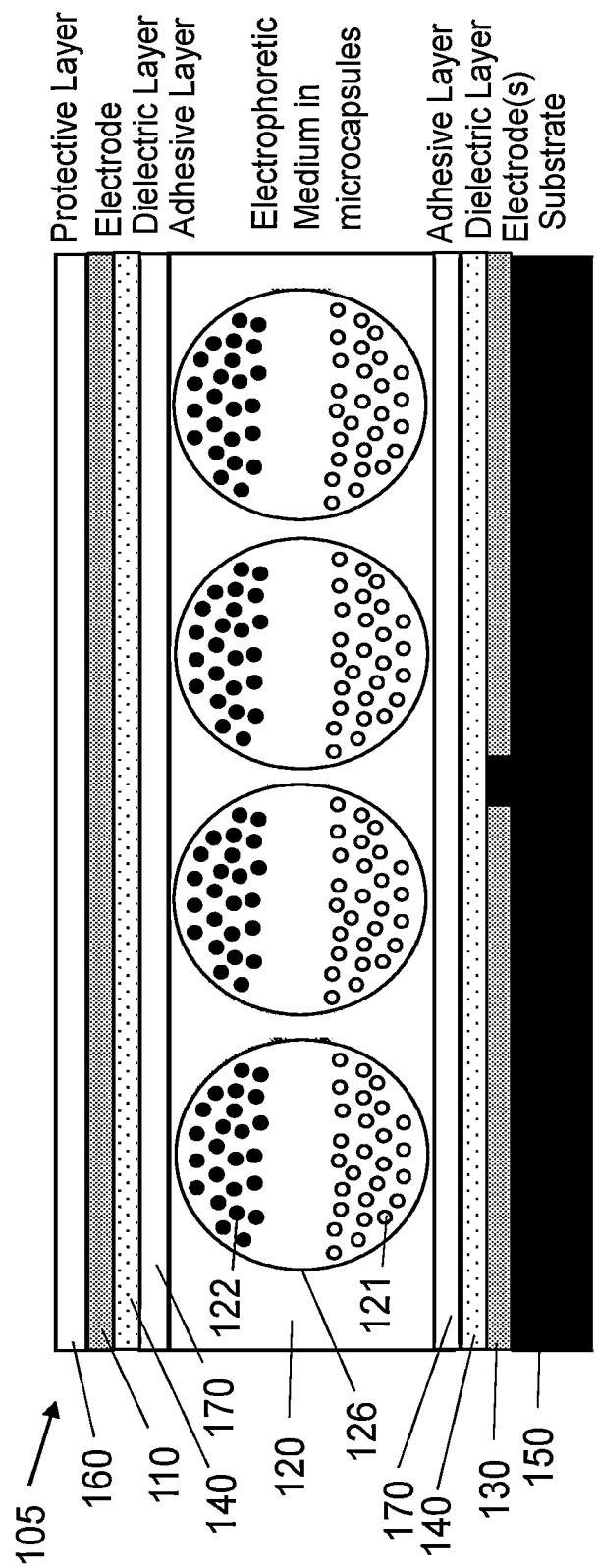
FIG. 1E illustrates the use of a dielectric layer with an encapsulated electrophoretic medium.
Figure 1F:
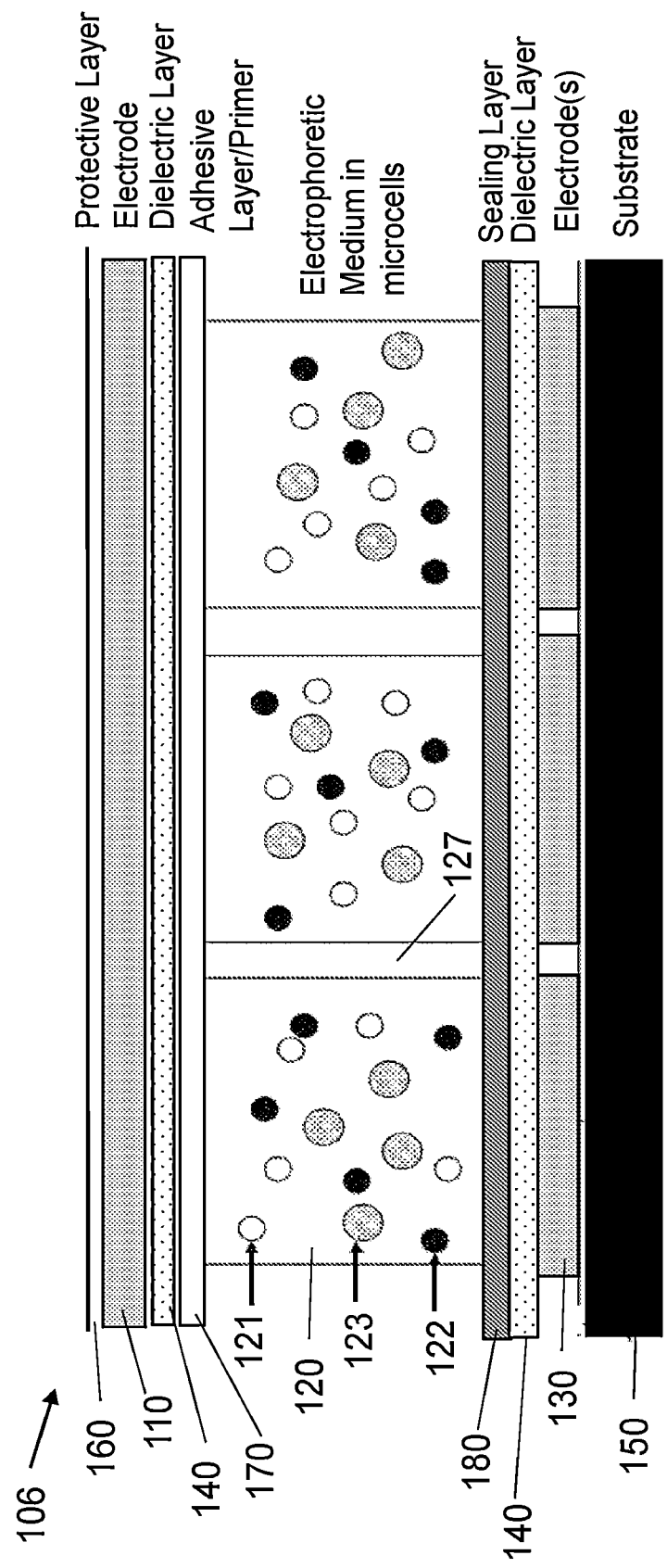
FIG. 1F illustrates the use of a dielectric layer with an electrophoretic medium contained in microcells.

Specific dielectric layers may be incorporated into electrophoretic displays at various locations relative to the electrophoretic medium as shown in FIGS. 1A-1F. An electrophoretic display (101, 102, 103, 104, 105, 106) typically includes a top transparent electrode 110, an electrophoretic medium 120, and a bottom electrode 130, which is often a pixel electrode of an active matrix of pixels controlled with thin film transistors (TFT). The electrophoretic medium 120 contains at least one electrophoretic particle 121, however a second electrophoretic particle 122, or a third electrophoretic particle 123, or more is feasible. The electrophoretic medium 120 is typically compartmentalized such by a microcapsule 126 or the walls of a microcell 127. A dielectric layer 140 can be disposed adjacent any of the layers, however, it is typically adjacent an electrode layer (110 or 130). There may be more than one dielectric layer 140 in a given electrophoretic display (105, 106), however only one layer is more common. The dielectric layer 140 may be of a type described below. The entire display stack is typically disposed on a substrate 150, which may be rigid or flexible. The display (101, 102, 103, 104, 105, 106) typically also includes a protective layer 160, which may simply protect the top electrode 110 from damage, or it may envelop the entire display (101, 102) to prevent ingress of water, etc. Electrophoretic displays (101, 102, 103, 104, 105, 106) may also include adhesive layers 170 and sealing layers 180 as needed. In some embodiments, the dielectric layer 140 is disposed between an electrode layer (110, 130) and the adhesive layer 170, as in the displays shown in FIGS. 1C and 1D. In some embodiments, a dielectric layer 140 is disposed above and below the electrophoretic medium 120, as shown in FIGS. 1E and 1F. An adhesive layer 170 may be optionally disposed between the dielectric layer 140 and the electrophoretic medium. In some embodiments (104, 106), the adhesive layer 170 may include a primer component to improve adhesion to the electrode layer 110, or a separate primer layer (not shown in FIG. 1A-1F) may be used. (The structures of electrophoretic displays and the component parts, pigments, adhesives, electrode materials, etc., are described in many patents and patent applications published by E Ink Corporation, such as U.S. Pat. Nos. 6,922,276; 7,002,728; 7,072,095; 7,116,318; 7,715,088; and 7,839,564, all of which are incorporated by reference herein in their entireties.

Figure 2:
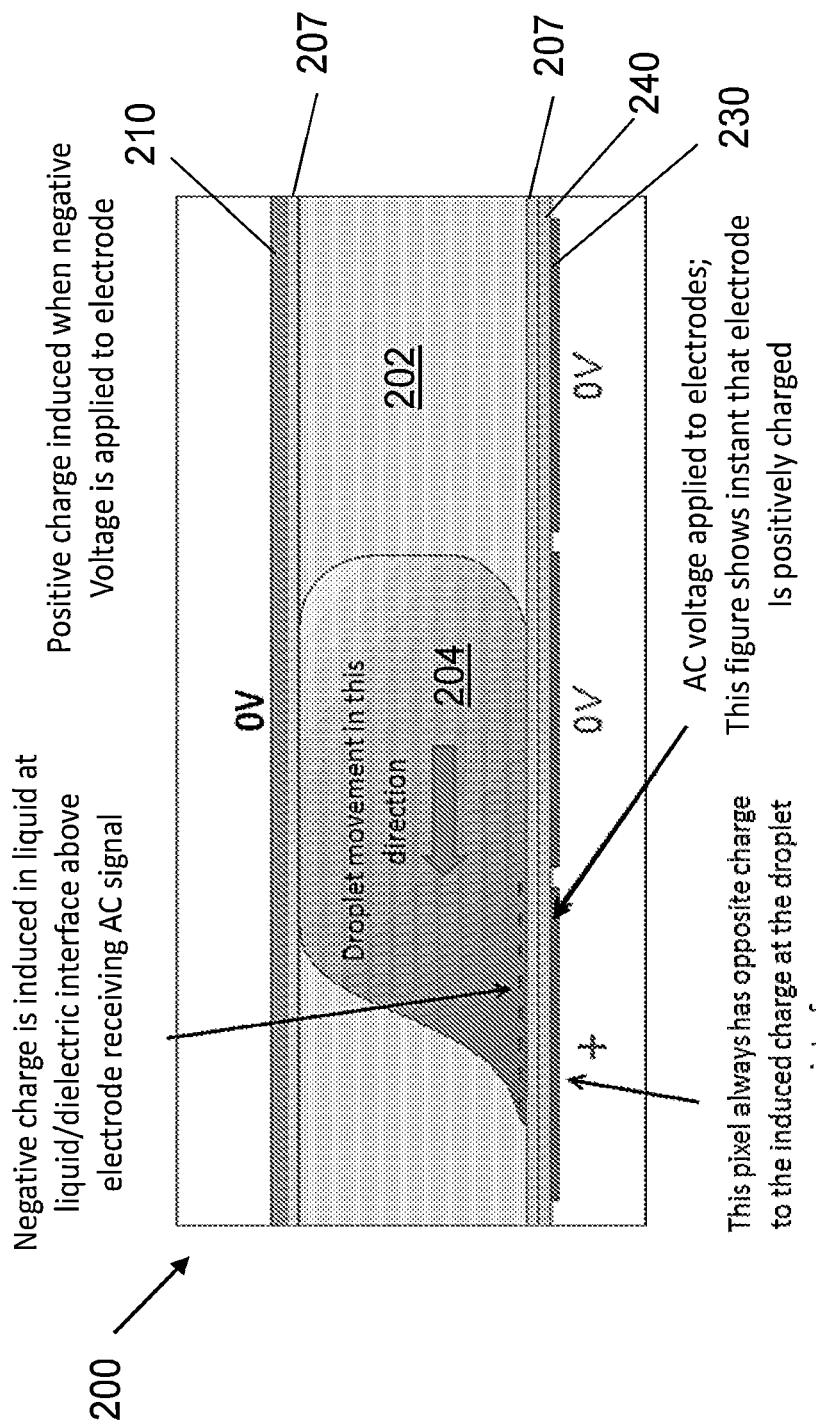
FIG. 2 depicts the movement of an aqueous-phase droplet between adjacent electrodes by providing differing charge states on adjacent electrodes. Typically a dielectric layer and a hydrophobic layer are disposed between the pixel electrodes and a droplet.

Dielectric layers of the invention may also be incorporated into electrowetting on dielectric (EWoD) devices, such as used for electrowetting displays or "lab on a chip" microfluidic devices. The fundamental operation of an EWoD device is illustrated in the sectional image of FIG. 2. The EWoD 200 includes a cell filled with an oil 202 and at least one aqueous droplet 204. The cell gap is typically in the range 50 to 200 μm, but the gap can be larger. In a basic configuration, as shown in FIG. 2, a plurality of propulsion electrodes 230 are disposed on one substrate and a singular top electrode 210 is disposed on the opposing surface. The cell additionally includes hydrophobic coatings 207 on the surfaces contacting the oil layer, as well as a dielectric layer 240 between the propulsion electrodes 230 and the hydrophobic coating 207. (The upper substrate may also include a dielectric layer, but it is not shown in FIG. 2). The hydrophobic layer prevents the droplet from wetting the surface. When no voltage differential is applied between adjacent electrodes, the droplet will maintain a spheroidal shape to minimize contact with the hydrophobic surfaces (oil and hydrophobic layer). Because the droplets do not wet the surface, they are less likely to contaminate the surface or interact with other droplets except when that behavior is desired.

While it is possible to have a single layer for both the dielectric and hydrophobic functions, such layers typically require thick inorganic layers (to prevent pinholes) with resulting low dielectric constants, thereby requiring more than 100V for droplet movement. To achieve low voltage actuation, it is better to have a thin dielectric layer for high capacitance and to be pinhole free, topped by a thin organic hydrophobic layer. With this combination it is possible to have electrowetting operation with voltages in the range+/−10 to +/−50V, which is in the range that can be supplied by conventional TFT arrays. In some embodiments, the hydrophobic layer comprises a fluoropolymer, such as a perfluoropolymer, such as TEFLON-PTFE (polytetrafluoroethylene), TEFLON-AF (amorphous polytetrafluoroethylene copolymer), CYTOP (poly(perfluoro-butenylvinyl ether), or FLUOROPEL (perfluoroalkyl copolymers). Other, newer, hydrophobic coatings may also be used, such as described in U.S. Pat. No. 9,714,463. Typically, the hydrophobic layer is coated onto the dielectric layer by spin coating, however other deposition methods, such as slot or dye coating, or spray coating, may also be used.

When a voltage differential is applied between adjacent electrodes, the voltage on one electrode attracts opposite charges in the droplet at the dielectric-to-droplet interface, and the droplet moves toward this electrode, as illustrated in FIG. 2. The voltages needed for acceptable droplet propulsion depend on the properties of the dielectric and hydrophobic layers. AC driving is used to reduce degradation of the droplets, dielectrics, and electrodes by various electrochemistries. Operational frequencies for EWoD can be in the range 100 Hz to 1 MHz, but lower frequencies of 1 kHz or lower are preferred for use with TFTs that have limited speed of operation.

Figure 3:
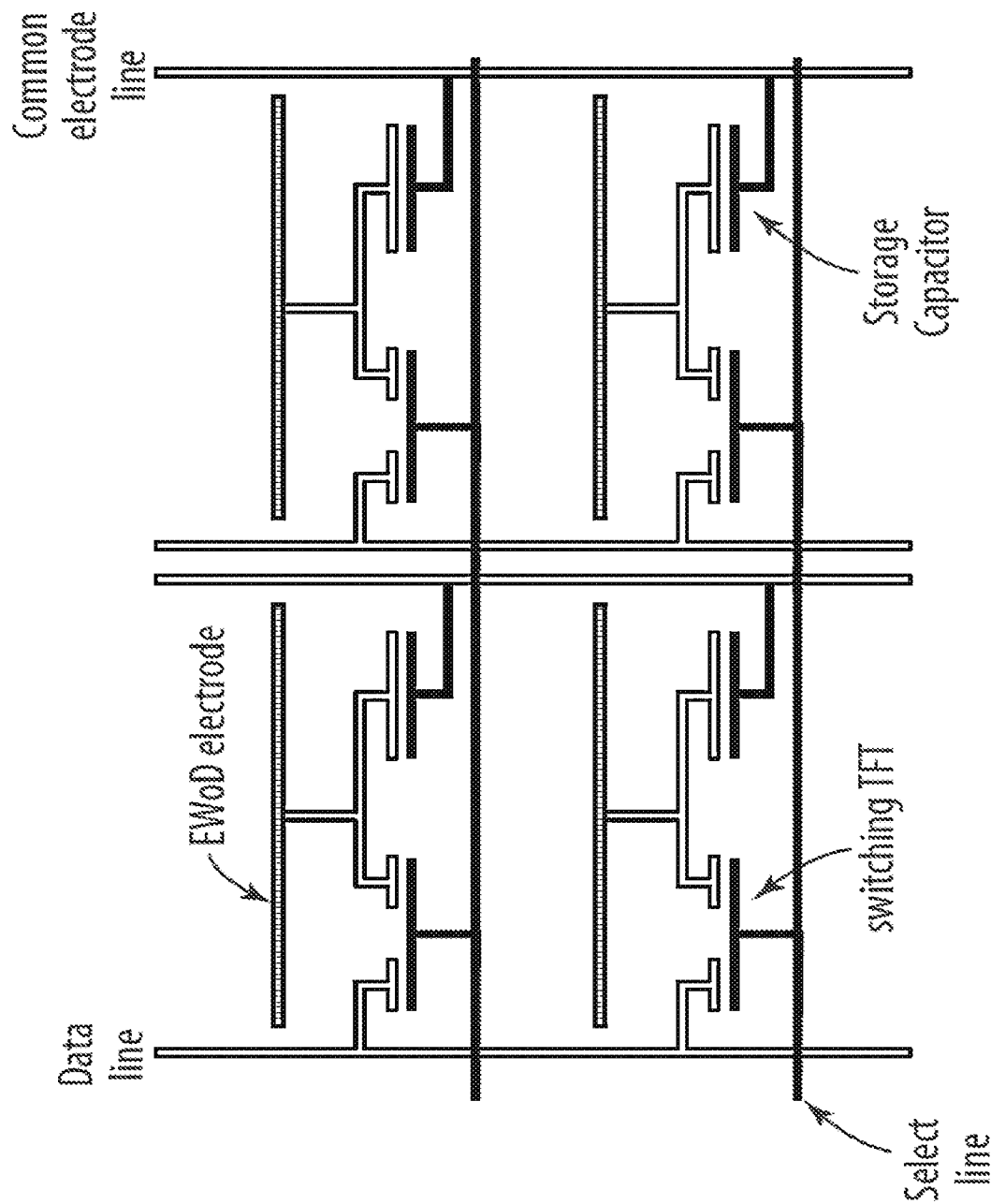
FIG. 3 is a simplified circuit diagram showing how an EWoD device can be driven similar to an active matrix of pixel electrodes for a display.

As shown in FIG. 2, the top electrode 210 is a single conducting layer normally set to zero volts or a common voltage value (VCOM) to take into account offset voltages on the propulsion electrodes 230 due to capacitive kickback from the TFTs that are used to switch the voltage on the electrodes (see FIG. 3). The top electrode can also have a square wave applied to increase the voltage across the liquid. Such an arrangement allows lower propulsion voltages to be used for the TFT connected propulsion electrodes 230 because the top plate voltage 210 is additional to the voltage supplied by the TFT.

As shown in FIG. 3, an active matrix of propulsion electrodes can be arranged to be driven with data and gate (select) lines much like an active matrix in an electrophoretic or liquid crystal display. The gate (select) lines are scanned for line-at-a time addressing, while the data lines carry the voltage to be transferred to propulsion electrodes for electrowetting operation. If no movement is needed, or if a droplet is meant to move away from a propulsion electrode, then 0V will be applied to that (non-target)

propulsion electrode. If a droplet is meant to move toward a propulsion electrode, an AC voltage will be applied to that (target) propulsion electrode.

Figure 4:
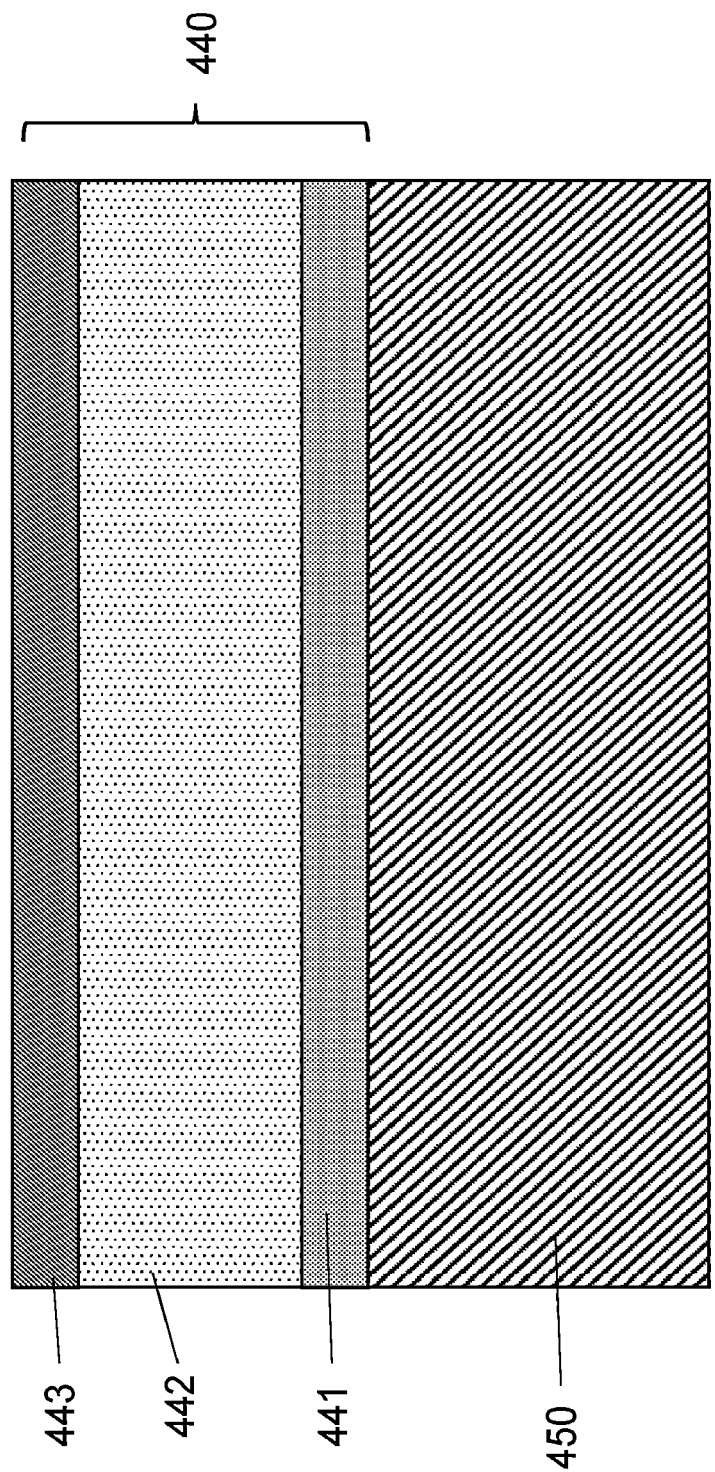
FIG. 4 illustrates an embodiment of a dielectric layer on a substrate.

An embodiment of a dielectric layer 440 of the invention is shown in FIG. 4, disposed on a substrate 450. The dielectric layer includes a first [barrier] layer 441, a second [thick] layer 442, and a third [capping] layer 443. The first layer 441 includes aluminum oxide or hafnium oxide, and has a thickness between 9 nm and 80 nm. The second layer 442 includes tantalum oxide or hafnium oxide, and has a thickness between 40 nm and 250 nm. The third layer 443 includes tantalum oxide or hafnium oxide, and has a thickness between 5 nm and 60 nm. Typically, the second and third layers comprise different materials, for example, the second layer can comprise primarily hafnium oxide while the third layer comprises primarily tantalum oxide. Alternatively, the second layer can comprise primarily tantalum oxide while the third layer comprises primarily hafnium oxide. In preferred embodiments, the first layer is aluminum oxide. In preferred embodiments, the first layer is from 20 to 40 nm thick, while the second layer is 100 to 150 nm thick, and the third layer is 10 to 35 nm thick. The thickness of the various layers can be measured with a variety of techniques, including, but not limited to, scanning electron microscopy, ion beam backscattering, X-ray scattering, transmission electron microscopy, and ellipsometry. The resulting dielectric layer 440 is flat, pinhole-free and chemically-resistant.

Figure 5:
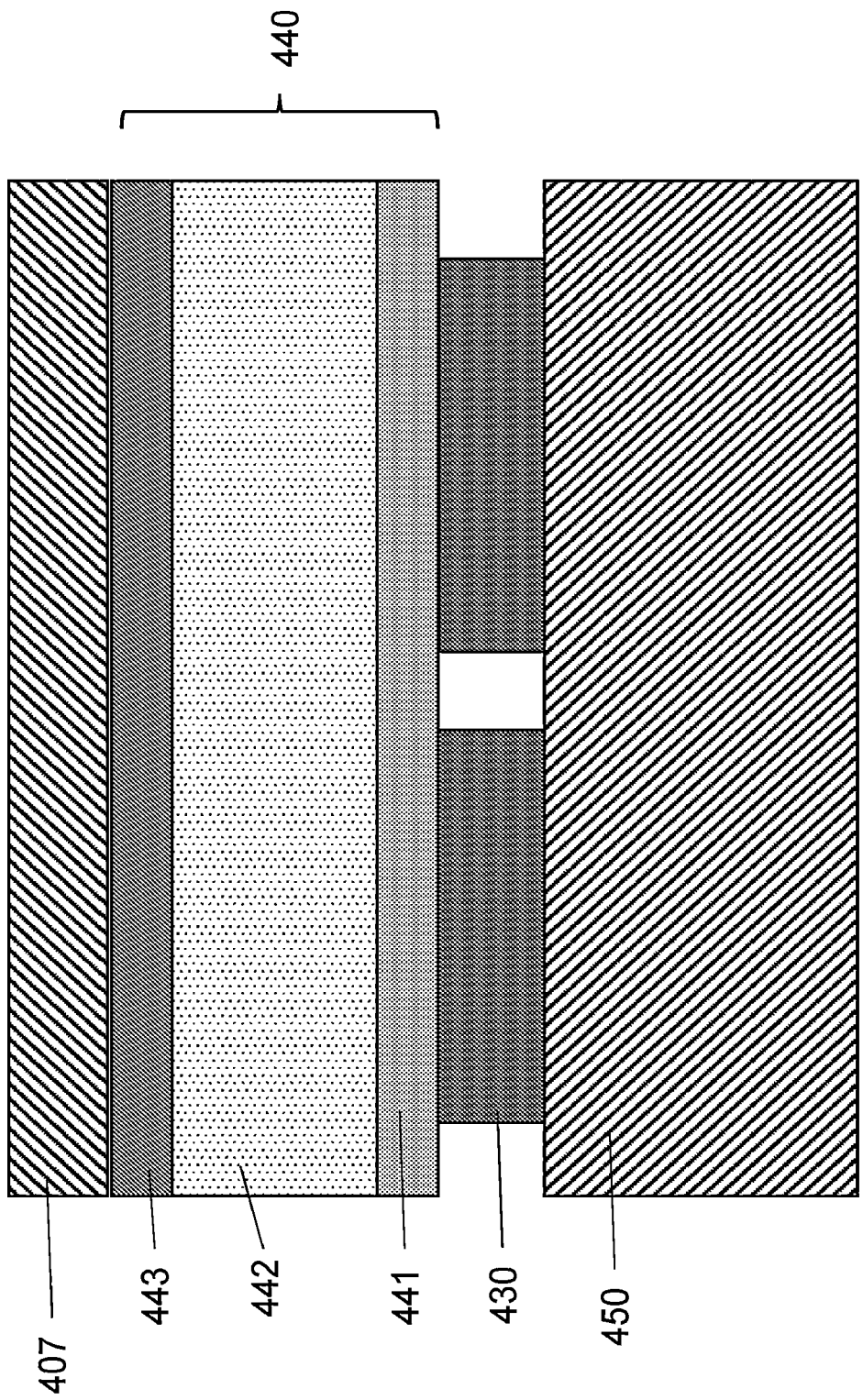
FIG. 5 illustrates an embodiment of a dielectric layer on a substrate that includes pixel electrodes.

A dielectric layer 440, such as shown in FIG. 4, can be directly-coated on any type of substrate that is compatible with the first layer 441 and the conditions required to deposit the first layer (discussed below). A dielectric layer 440 may, for example, be coated onto pixel electrodes 430 of an active matrix, as shown in FIG. 5. A dielectric layer 440 may be coated onto a printed circuit board or other microfabricated structure. Additionally, the third layer 443 may be coated with a hydrophobic layer 407 for use in electrowetting applications, as discussed above with respect to FIG. 2. Such combinations of dielectric layer 440 and hydrophobic layer 407 are preferred to be reasonably thin, i.e., less than 600 nm thick, e.g., less than 400 nm thick, e.g., less than 300 nm thick. The lower bounds of a three-layer dielectric stack with a hydrophobic coating are greater than 60 nm thick, e.g., greater than 100 nm thick, e.g., greater than 150 nm thick.

Figure 6:
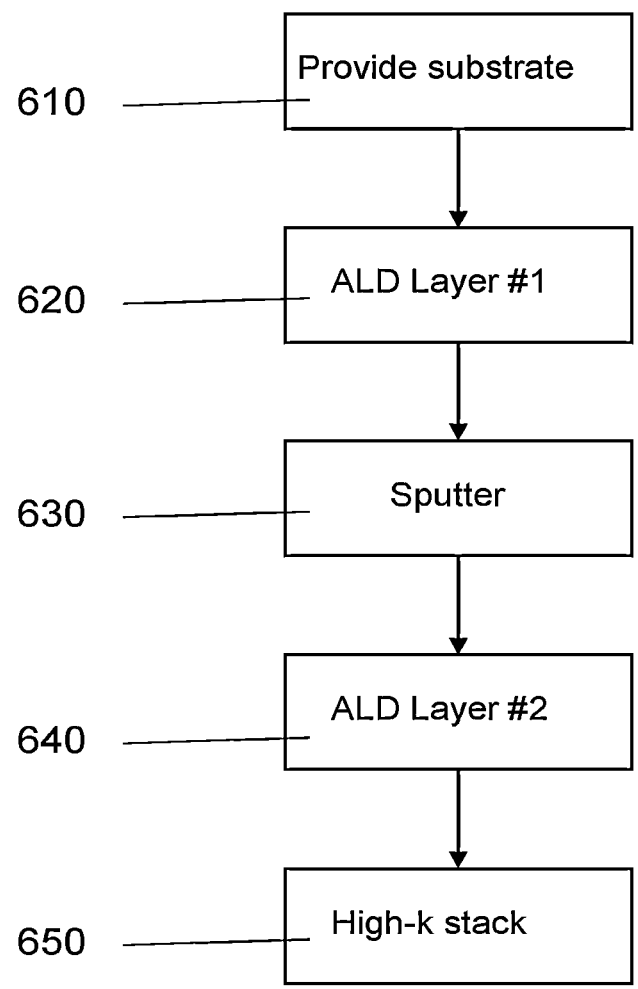
FIG. 6 illustrates the steps for creating a dielectric layer.

The methods for making a dielectric layer of the invention are described with respect to FIG. 6. In the initial step 610 a substrate is provided upon which the dielectric stack will be coated. The substrate is typically cleaned prior to coating, for example with ethanol or isopropyl alcohol. The substrate may be any material, provided that the material is stable during the atomic layer deposition (ALD) and sputtering steps described below. For example, the substrate may be a printed circuit board, coated glass, such as ITO-coated glass, or an active matrix TFT backplane microfabricated on glass or other substrate material. The next step 620 is to deposit the first layer upon the substrate using atomic layer deposition, typically plasma-assisted ALD or (thermal) water-vapor assisted ALD. For example, a first layer of aluminum oxide may be fabricated using trimethylaluminum (Al(CH$_3$)$_3$) or Ta[(N(CH$_3$)$_2$)$_3$NC(CH$_3$)$_3$] in conjunction with oxygen plasma at around 180° C. substrate temperature and low pressure (less than 100 mbar). Alternatively, a layer of aluminum oxide may be deposited using a trimethylaluminum-water process. The atomic layer deposition may be done at a rate of greater than 0.1 nm/min, e.g., 0.2 nm/min or greater. The final thickness of aluminum oxide or a hafnium oxide is typically between 9 nm and 80 nm thick. Details of these ALD process are described by Bent and co-workers in "A brief review of atomic layer deposition: from fundamentals to applications," Materials Today, (2014), vol. 17, No. 5, p. 236-46, which is incorporated by reference in its entirety herein.

Once the first ALD layer has been applied to the substrate, the resulting coated substrate is coated with sputtering, such as magnetron sputtering, to produce a second, thicker layer in the third step 630. Typically the second, thicker, layer is primarily tantalum oxide or hafnium oxide. The sputtering process is done in a mixed oxygen-argon atmosphere at room temperature and the sputtering target is a stoichiometric oxide of tantalum or hafnium or a metallic tantalum or hafnium target. The resulting sputtered tantalum oxide or a hafnium oxide layer has a thickness between 40 nm and 250 nm. While magnetron sputtering is preferred, other forms of sputtering, such as ion sputtering or plasma sputtering may also be used. The sputtering may be done at a rate of greater than 0.5 nm/min, e.g., 1 nm/min or greater, e.g., 2 nm/min or greater. Details of these processes are detailed by Kelly and Arnell, "Magnetron sputtering: a review of recent developments and applications," *Vacuum* 56 (2000) 159-172, which is incorporated by reference in its entirety herein. While the sputtering process is typically performed in a separate sputtering chamber, the methods of the invention could also be achieved in a singular reactor that is capable of both atomic layer and sputtering deposition.

After the sputtering step 630 has been completed, the resulting substrate with an ALD layer and a sputtered layer is subjected to a second atomic layer deposition step 640. Typically, this second ALD step is done with plasma assisted ALD using Ta[(N(CH$_3$)$_2$)$_3$NC(CH$_3$)$_3$] or Hf(N(CH$_3$)$_2$)$_4$ to produce a layer of tantalum oxide or hafnium oxide between 5 nm and 60 nm in thickness. Like the first ALD step 620, the second ALD step 640 is also done between 150 and 190° C. substrate temperature and low pressure (less than 100 mbar). After completion of this second ALD step 640, a substrate with a high-k stack (650) has been produced. The final high-k coating is typically between 100 and 700 nm in total thickness, with a combined dielectric strength of 6 MV/cm or greater. The high-k stack is also extremely smooth and nearly pinhole free as shown in the following example.

While it is not explicitly shown in FIG. 6, the final high-k stack may be coated with a hydrophobic layer using, e.g., spin coating, as described above. Such a combined high-k stack with hydrophobic coating is especially useful for electrowetting applications such as for electrowetting displays and microfluidic applications.

Example 1—Fabrication and Evaluation of an Al$_2$O$_3$/Ta$_2$O$_5$/Al$_2$O$_3$ Stack A high-k dielectric stack was fabricated using the techniques described above with respect to FIG. 6. An initial substrate of ITO-coated glass (Sigma-Aldrich) was coated with 25 nm of Al$_2$O$_3$ using oxygen plasma ALD using a Veeco/CNT Fiji F200 with a total deposition time of approximately 115 minutes and a substrate temperature of 180° C. The substrate with deposited Al$_2$O$_3$ was removed from the reactor and imaged using Bruker Dimension Icon atomic force microscopy tool. The image captured by the AFM instrument is shown in the lower right of FIG. 7. An exemplary surface roughness measurement at the dotted line across the AFM image is shown in bottom graph of FIG. 8. As expected, the first ALD step achieves a surface with little height variability.

Following the deposition of 25 nm of $Al_2O_3$ and imaging with AFM, the substrate was placed in a magnetron sputtering chamber Kurt Lesker LAB Line Sputter Deposition Tool, and 70 nm of $Ta_2O_5$ was deposited over about 30 minutes using a metallic tantalum sputtering target in an oxygen-argon environment. After the sputtering was completed, the resulting coated substrate was again imaged with AFM, as shown in the middle right image of FIG. 7 and the middle graph of FIG. 8. Notably, the surface variation is much greater after sputtering, and ridges have begun to appear across the coated surface. However, using sputtering, the dielectric layer was made almost 3 times thicker in less than half of the time of the previous ALD step.

Figure 7:
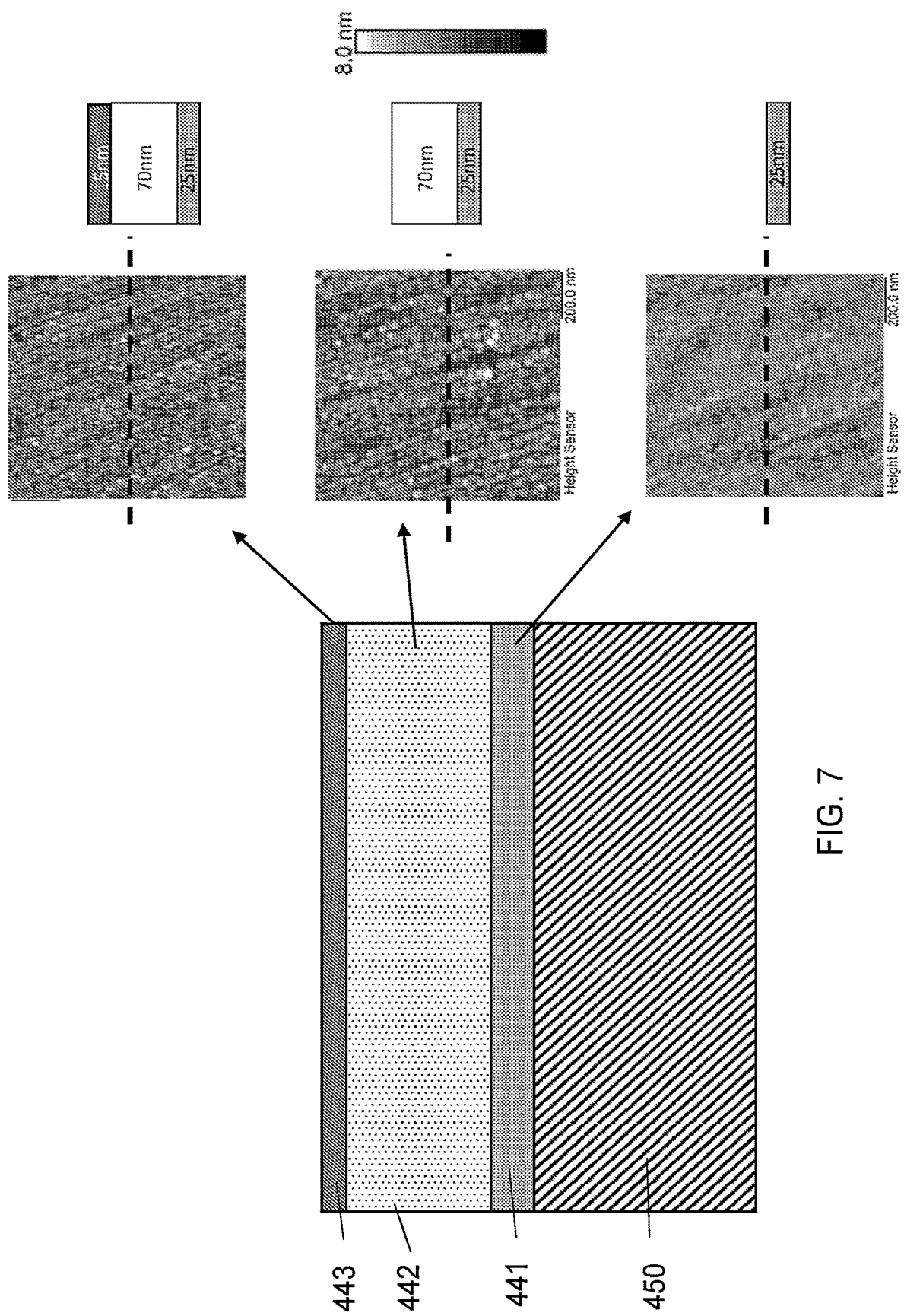
FIG. 7 shows atomic force microscopy images for each of the three layers in a dielectric stack of the invention.
Figure 8:
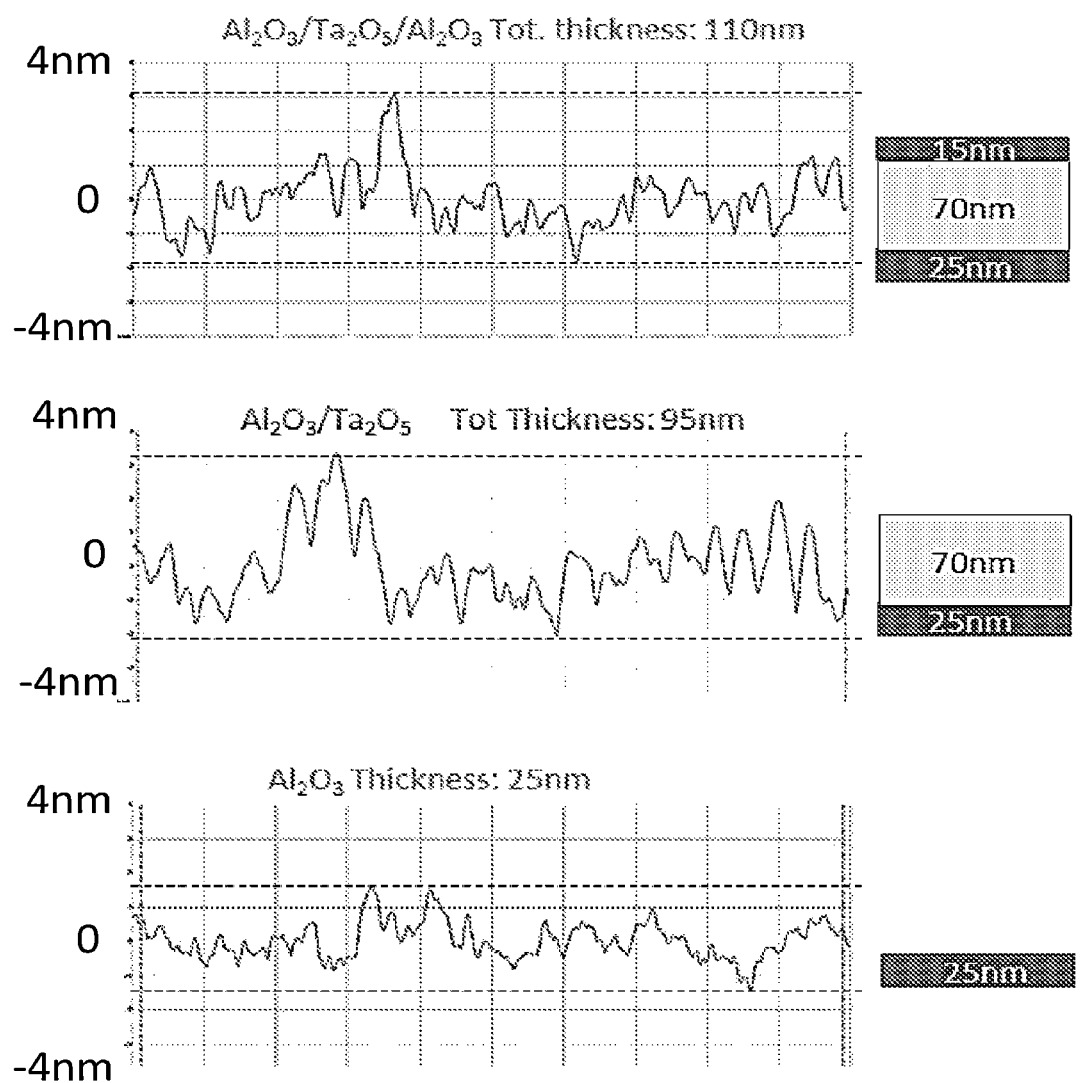
FIG. 8 shows an exemplary height measurement as a function of linear position in at the dotted line across the AFM images of FIG. 7.

Finally, after the sputtering step, the substrate was returned to the ALD machine, whereupon the $Al_2O_3$ process was repeated, but for only about 70 minutes resulting in an $Al_2O_3/Ta_2O_5/Al_2O_3$ stack as shown in FIG. 7, i.e., having a base layer of 25 nm, a middle layer of 70 nm, and a capping layer of 15 nm. The resulting three-layer stack was then imaged with the AFM to produce the image shown in the upper right of FIG. 7. Again, an exemplary line profile (dashed line) is shown as the top graph in FIG. 8. Remarkably, some amount of surface roughness from the sputtering process was smoothed out with the application of the second ALD layer, however some of the ridges produced by the sputtering process are still present. After imaging, the resulting $Al_2O_3/Ta_2O_5/Al_2O_3$ stack was evaluated for pinholes by electroplating copper on the dielectric layer with a copper sulfate solution. The stack showed very little leakage current after electroplating, suggesting that there were very few pinholes in the dielectric layer, which was additionally verified by light microscopy (not shown).

Figure 9A:
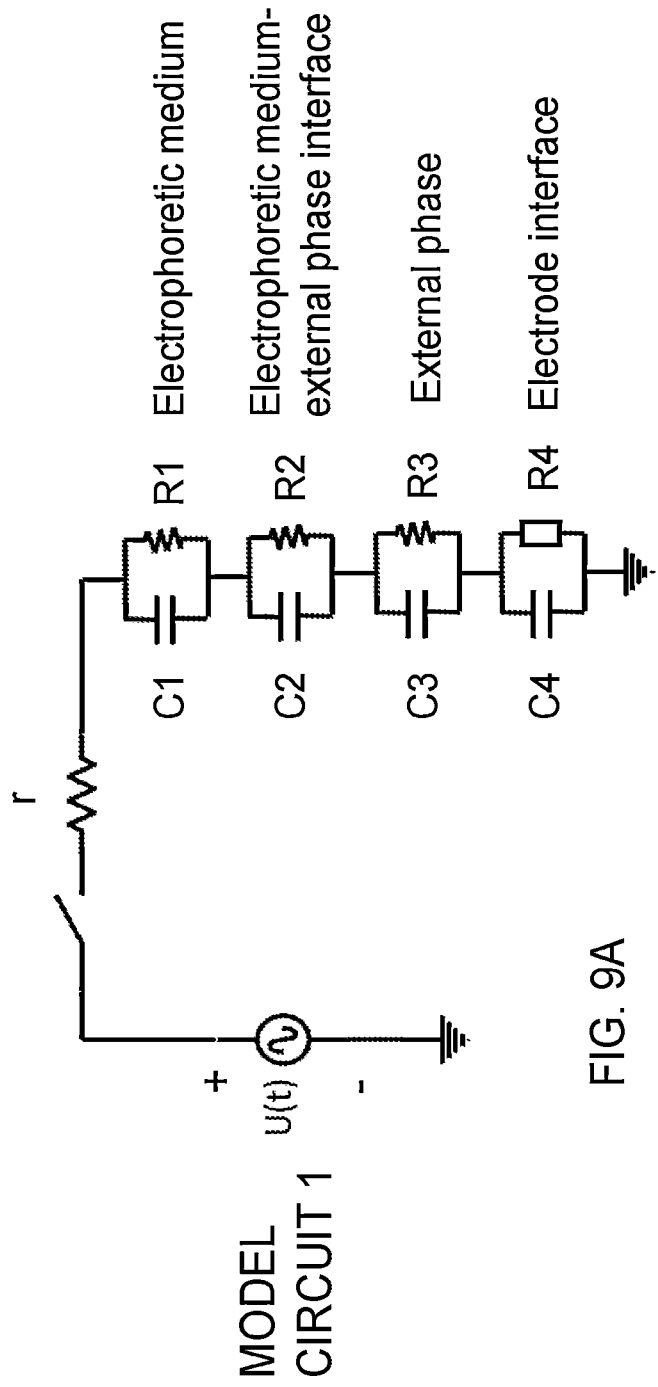
FIG. 9A illustrates a first model circuit that can be used to calculate a baseline for remnant voltage response in an electrophoretic display.
Figure 9B:
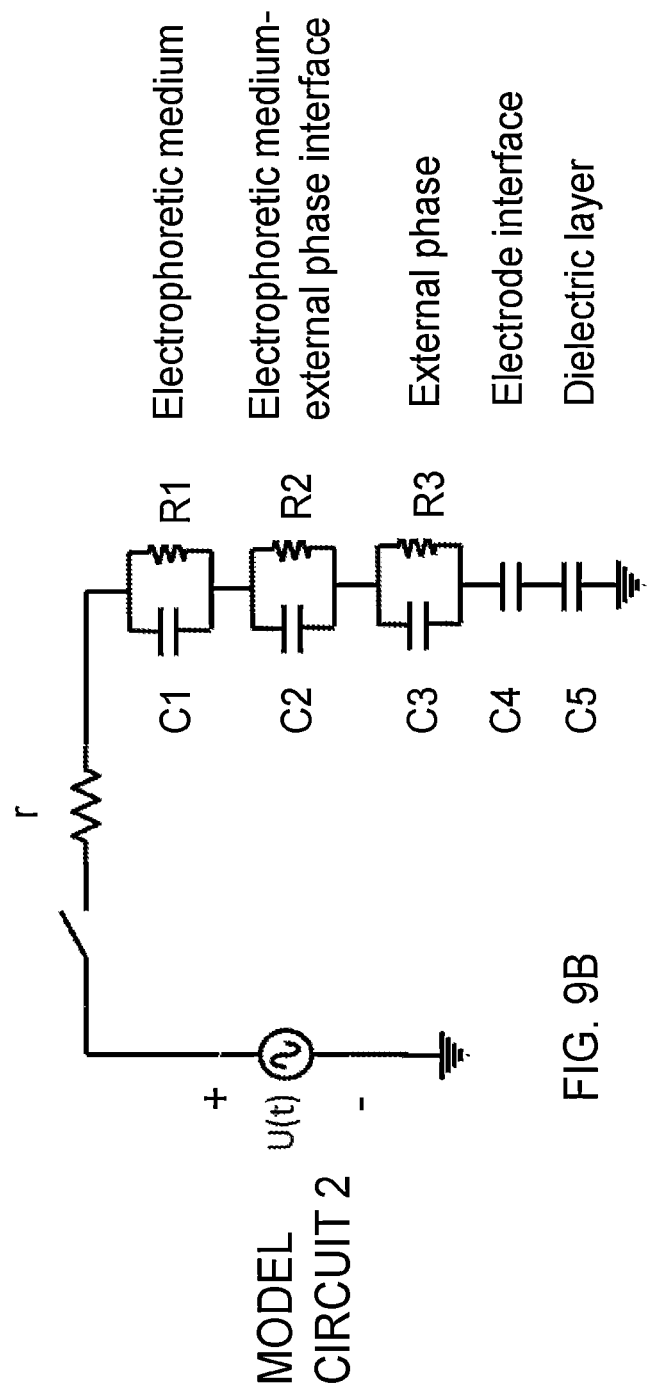
FIG. 9B illustrates a second model circuit that can be used to calculate the benefit of adding one or more dielectric layers to an electrophoretic display.

It is possible to model the response of electrophoretic displays both without (FIG. 9A) and with (FIG. 9B) dielectric layers as described herein. As shown in FIGS. 9A and 9B, the "stack" of an electrophoretic display including a dielectric layer between the electrophoretic medium and the top electrode, as in FIG. 1B, can be modeled as a series of Voigt elements, i.e., having both a resistance (R) and a capacitance (C) in a parallel arrangement, thereby allowing for the calculation of a voltage response of each component when the stack is driven by a waveform ("stack" in FIGS. 10A and 10B). While it is self-evident that simple linear models are oversimplifications of the electrical behavior of an actual electrophoretic display, they are instructive to demonstrate the benefits of incorporating dielectric layers into the electrophoretic displays, especially when the displays are driven with waveforms that are not impulse balanced.

Referring now to FIGS. 9A and 9B, typical electrophoretic fluids (hereinafter the "internal phase"), comprising solvents with low dielectric constant (about 2) have a bulk capacitance "C1" in the range of 0.02-5 $nF/cm^2$ and a resistance "R1" of about 1-10 $M\Omega\cdot cm^2$ when incorporated into compartments of thickness in the range of 10-25 microns. The capacitance at the interface between the electrophoretic fluid and the other layers comprising the display (collectively referred to as the "external phase") is more difficult to estimate, but may be approximated by combining two capacitors in series, the dielectric thickness of each being approximated by the Debye length in each medium (i.e., the internal and external phases). This gives an estimate for C2 of about 10-100 $nF/cm^2$. The resistance R2 of the interface, corresponding to passage of ions across the boundary, is also difficult to estimate. If this resistance is too high, the display will show complete electrical (and probably optical) kickback (a phenomenon whereby a pixel returns partway to a previous state after an update is complete). The value of R2 that gives best agreement with electrical current measurements when driving a typical display is about the same as the resistance of the external phase, i.e., in the range 1-10 $M\Omega\cdot cm^2$. The bulk capacitance of the external phase, C3, assuming that it comprises a polymeric material of dielectric constant about 10 containing mobile ions, is estimated to be about 0.1-10 $nF/cm^2$. The resistance of the external phase, R3, is in the range 1-10 $M\Omega\cdot cm^2$. Finally, the interfacial capacitance C4 at the electrode boundary is estimated from the Debye length in the doped polymeric external phase. Its conductivity is about the same as that of the internal phase but the mobility of the charge carriers is much lower, since the viscosity of the polymer is orders of magnitude higher than that of the electrophoretic solvent. As a result the concentration of ions must be much higher in the external phase than in the internal phase and consequently the Debye length much less. The capacitance of the interface is estimated as in the range of 2-20 $\mu F/cm^2$, i.e., much larger than any other capacitance in the system. It is possible that electrochemical reactions at this interface might produce a "resistive" path, illustrated schematically as R4 in FIG. 9A, although this will not be a simple resistor. This path is undesired as it may lead to eventual degradation of the electrodes, as described above. Methods to mitigate electrochemical currents in electrophoretic displays are discussed in detail, for example, in U.S. Pat. No. 9,726,957, which is incorporated herein by reference in its entirety.

The time required to produce an image (aka update time) is related to the RC time constant for charging the capacitor C2, which is typically less than 1 second. The RC time constant for charging C4 is however much longer than this, typically on the order of 100 seconds, so C4 will only be partially charged at the time that C2 is fully charged. Thus, in this model, the voltage across C4 becomes an approximation of the "remnant voltage" stored in the display. In a DC-balanced waveform this remnant voltage is mostly diminished during the course of the update. However, in a non-DC-balanced waveform, the remnant voltage is not diminished and can build up on the system. Because the RC time for charging and discharging C4 is so long, it is not practical to fully discharge the C4 capacitor by grounding the display. Even worse, if there is a possibility of discharge of C4 by means of the electrochemical reactions indicated as R4 in FIG. 9A, there may also be a slow electrochemical degradation of the electrodes in the undriven display caused by the remnant voltage after an update. Such electrochemistry is irreversible and will lead to a degradation in performance, and ultimately a failure of the display.

FIG. 9B shows how the model can be adjusted to accommodate an added dielectric layer, which provides a capacitance C5 according to the invention. It can be seen that resistive element R4 is missing from the representation of the electrode interface. Because the dielectric layer separates the electrode from the external phase, there is now no possibility of electron transfer. Capacitors C4 and C5 are in series, so the RC constant for buildup of remnant voltage is lower than in the case shown in FIG. 9A lacking the capacitor C5. Because the RC time constant for buildup and discharge of remnant voltage is shorter when C5 is included, it becomes more practical to directly discharge the remnant voltage in a reasonable time. Such discharging can be accomplished with, e.g., the methods and circuits described in U.S. Pat. No. 10,475,396, which is incorporated herein by reference in its entirety.

Figure 10A:
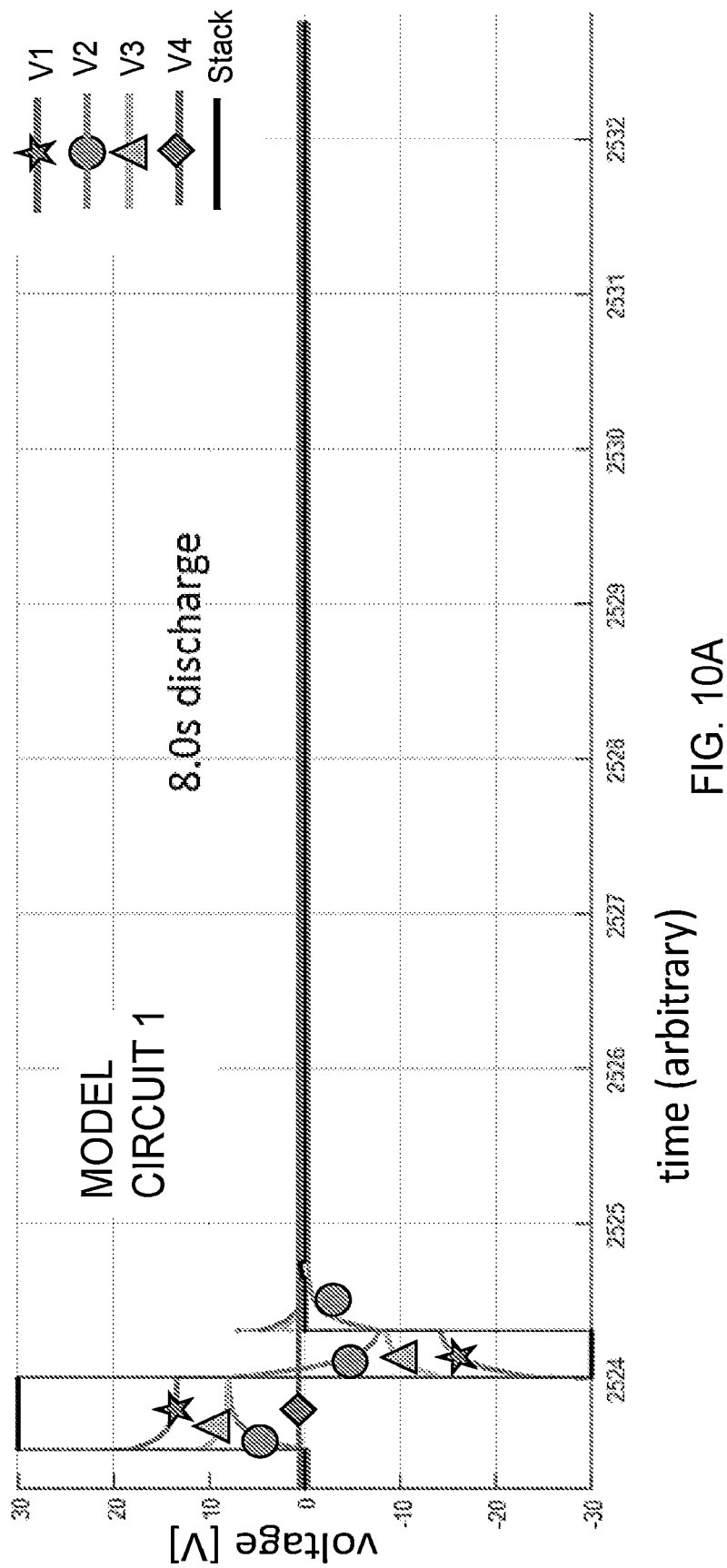
FIG. 10A is the calculated voltage response for each component C1-C4 of the model circuit of FIG. 9A when the stack is drive with the waveform "stack".
Figure 10B:
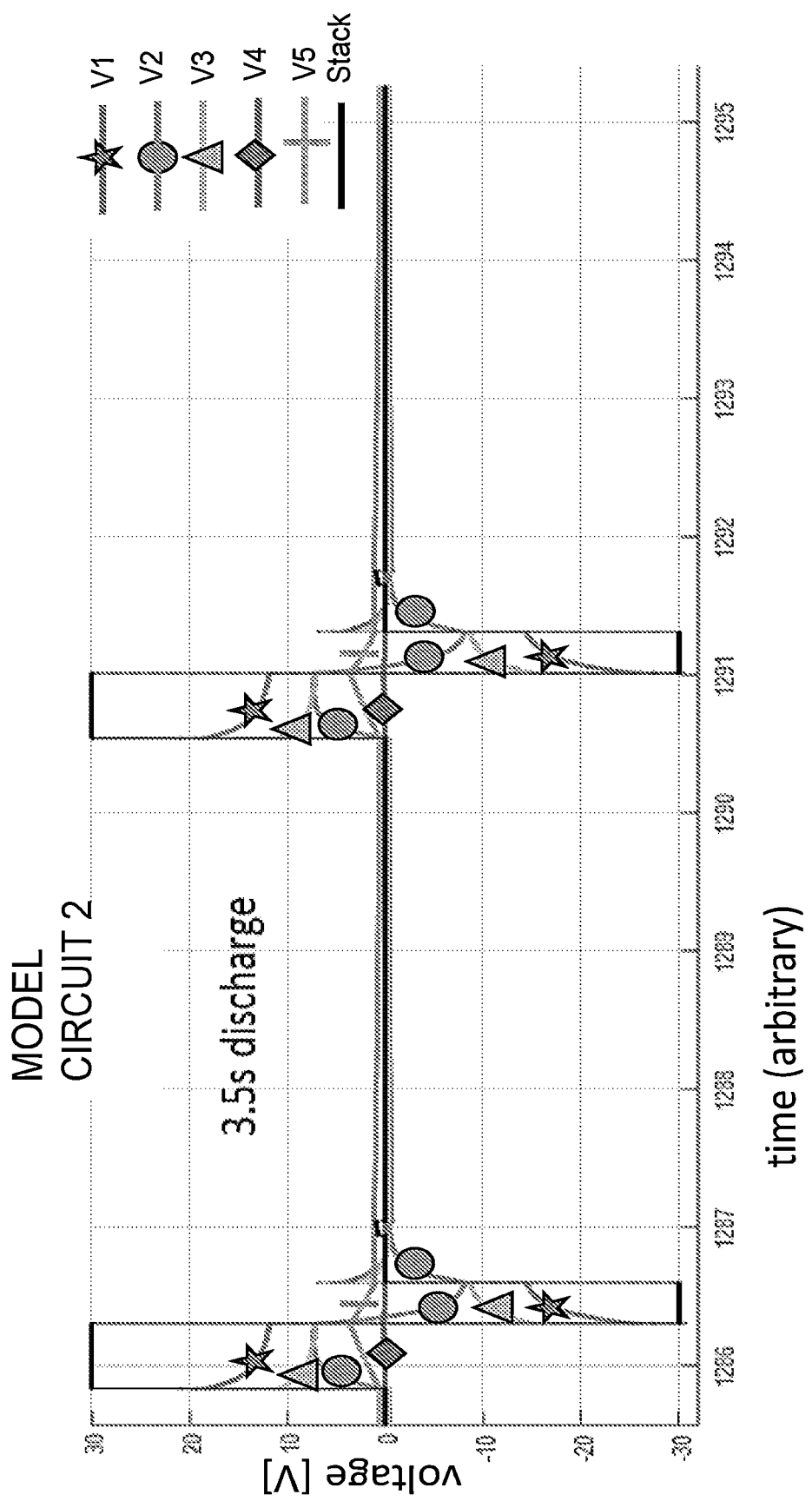
FIG. 10B is the calculated voltage response for each component C1-C5 of the model circuit of FIG. 9B when the stack is drive with the waveform "stack".

FIGS. 10A and 10B show calculated voltages across the various Voigt elements in the model circuits of FIGS. 9A and 9B using a typical color-forming waveform. After driving with the waveform "stack," the equilibrium remnant voltage at each component shown. (V1 corresponds to component one having R1 and C1, etc.) Comparing the curves of FIGS. 10A and 10B, the models predict that the same long-term remnant voltage can be obtained roughly with a much shorter discharge time in the model system including the dielectric layer, i.e., 3.5 seconds of discharge for model circuit 2 (FIG. 9B) and 8 seconds of discharge of model circuit 1 (FIG. 9A).

Example 2—Change in Color Gamut Due to Dielectric Layer

As illustrated in the model circuits, the addition of the capacitance C5 to the dielectric layer slightly changes the voltages within the imaging layers of the display, and might be expected to affect the number of colors that can be achieved. The amount of color lost due to this voltage drop was experimentally verified using a four pigment (CMYW) test cell including silicon nitride layers of different thickness over the rear electrode of the display. Details of the test cell can be found in U.S. Pat. No. 9,921,451, which is incorporated by reference herein in its entirety. The results are shown below in Table 1.

TABLE 1

Effect of silicon nitride dielectric on color gamut of four-particle (CMYW) electrophoretic medium in a test cell.

| Silicon nitride thickness (nm) | Capacitance estimated (nF/cm$^2$) | Color gamut measured (dE$^3$) |
|---|---|---|
| 0 | n/a | 21000 |
| 20 | 332 | 18000 |
| 50 | 133 | 13000 |
| 75 | 89 | 11000 |

Table 1 shows the estimated capacitance of the dielectric based upon measured thickness, and the color gamut of the display as measured by applying a series of test waveforms and measuring with a calibrated color sensor. While the color gamut was largest for no dielectric, it was suitable for most purposes when the silicon nitride was in the range of 10-50 nm.

To assess the likelihood of unwanted electrochemistry and kickback, remnant voltage buildup was measured in the test displays of Table 1. To assess the remnant voltage buildup, each display was addressed with a series of impulses, whereby a positive voltage pulse was applied to the test display for time TV, after which the device is grounded for time T_ground. The relative amounts of impulse and grounding times can be expressed as a duty cycle. After the grounding period, each test display was placed in a float state for time T_float. During T_float the voltage across the display electrodes was measured. This pattern was repeated many times and recorded for each test display with electronic test equipment.

Figure 11A:
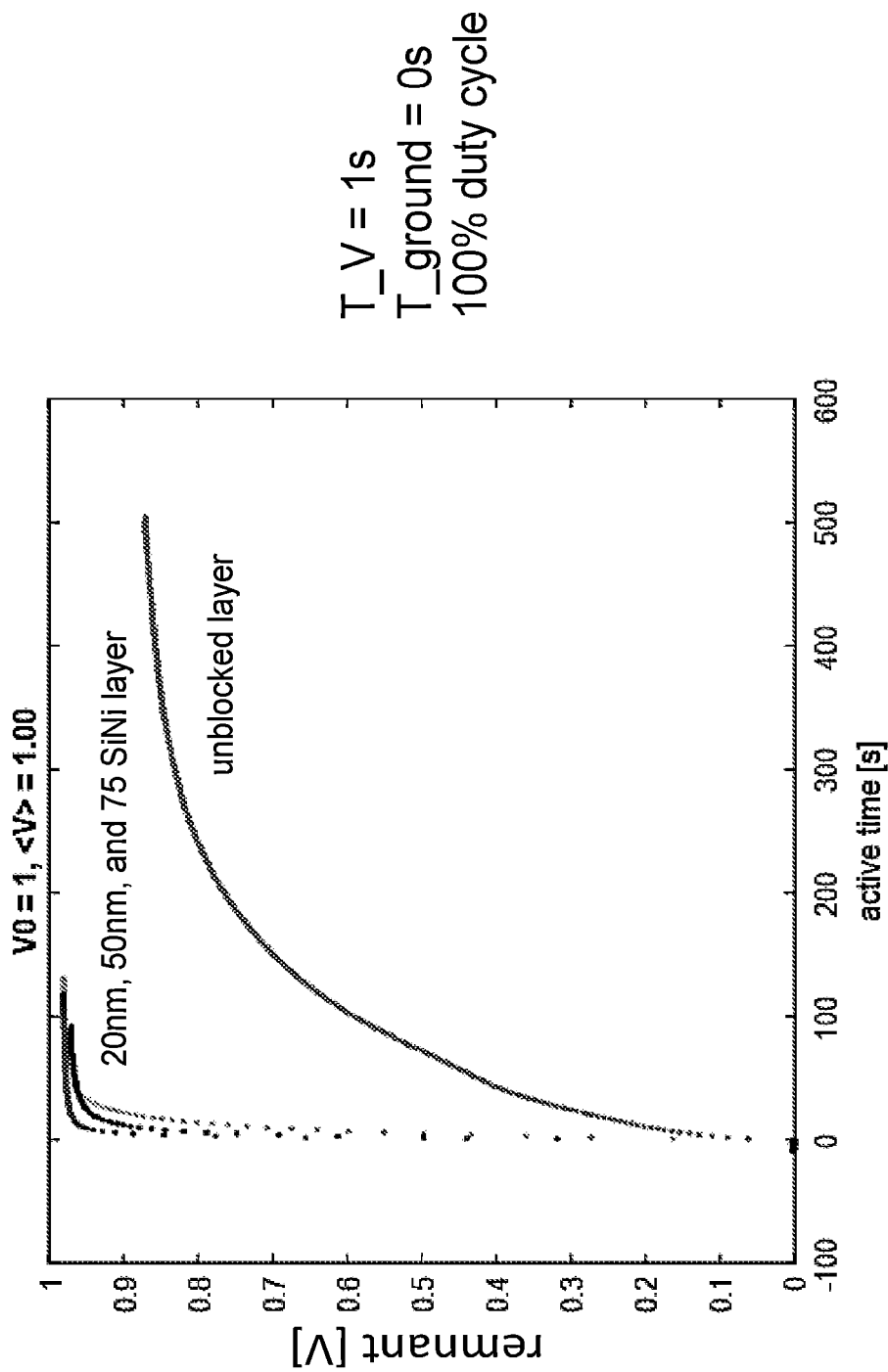
FIG. 11A shows the remnant voltage measured on test cells having a variety of SiNi dielectric layer thicknesses when driven with a 100% drive/ground duty cycle.
Figure 11B:
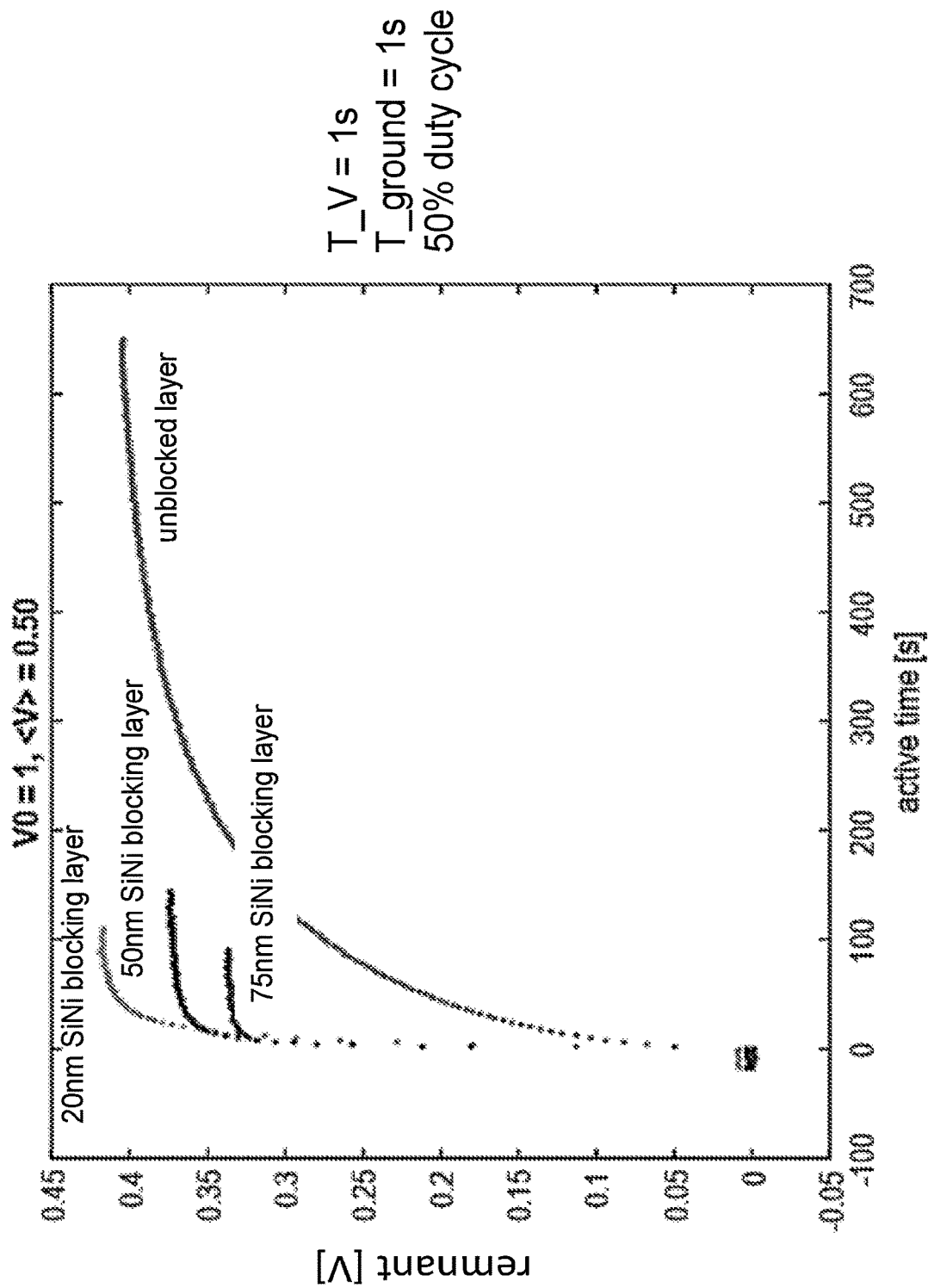
FIG. 11B shows the remnant voltage measured on test cells having a variety of SiNi dielectric layer thicknesses when driven with a 50% drive/ground duty cycle.
Figure 11C:
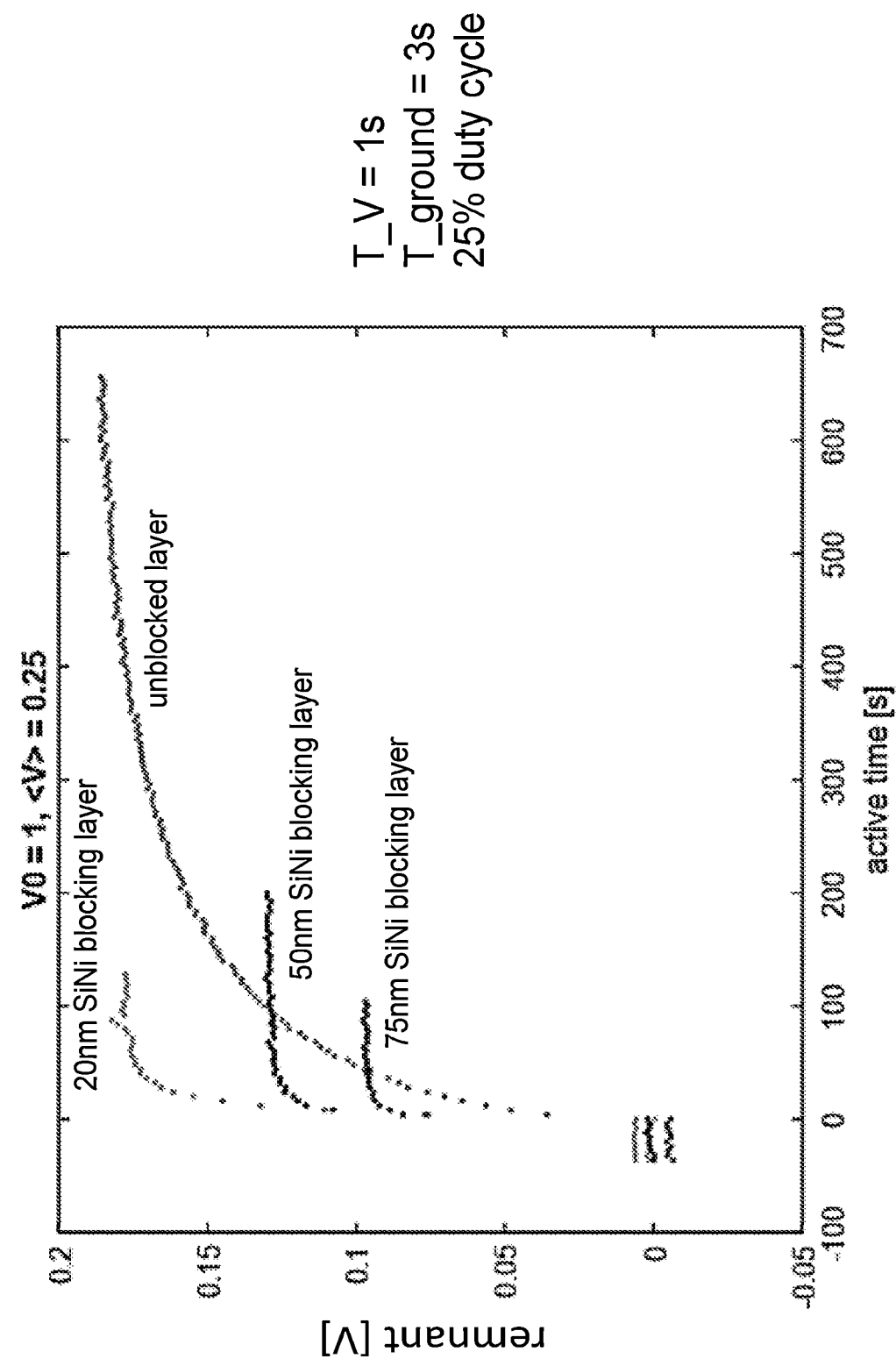
FIG. 11C shows the remnant voltage measured on test cells having a variety of SiNi dielectric layer thicknesses when driven with a 25% drive/ground duty cycle.

FIGS. 11A-11C show the results for a variety of grounding times, whereby the test voltage applied was 1V and T_V was one second. In FIG. 11A, the grounding time was zero, or 100% duty cycle. In FIG. 11B, the grounding time was 1 second or a 50% duty cycle. In FIG. 11C, the grounding time was 3 seconds or a 25% duty cycle. For each waveform, the measured remnant voltage is presented as a curve on the graph. To be sure, the sharper curves correspond to the SiNi dielectric layers while the more gentle curve corresponds to the test display with no SiNi dielectric layer. Furthermore, looking to FIG. 11B and FIG. 11C, the measured remnant voltage level roughly corresponded the thickness of the SiNi layer in that the thinnest SiNi layer resulted in the highest remnant voltage and the thickest SiNi layer resulted in the lowest remnant voltage. Notably, for the 25% duty cycle (drive/ground) both the 50 nm SiNi layer and the 75 nm SiNi layer achieved a remnant voltage lower than the unblocked layer within 100 second. Furthermore, when discharge of the remnant voltage is permitted by grounding between applied voltage pulses, the final equilibrium remnant voltage is the lowest in the module with the thickest dielectric layer (i.e., the smallest capacitance C5 of FIG. 9B). This result is surprising because it suggests that when the correct drive/ground duty cycle is coupled with the correct dielectric layer, both the electrophoretic response time and the overall remnant voltage can be decreased at the same time.

Figure 12:
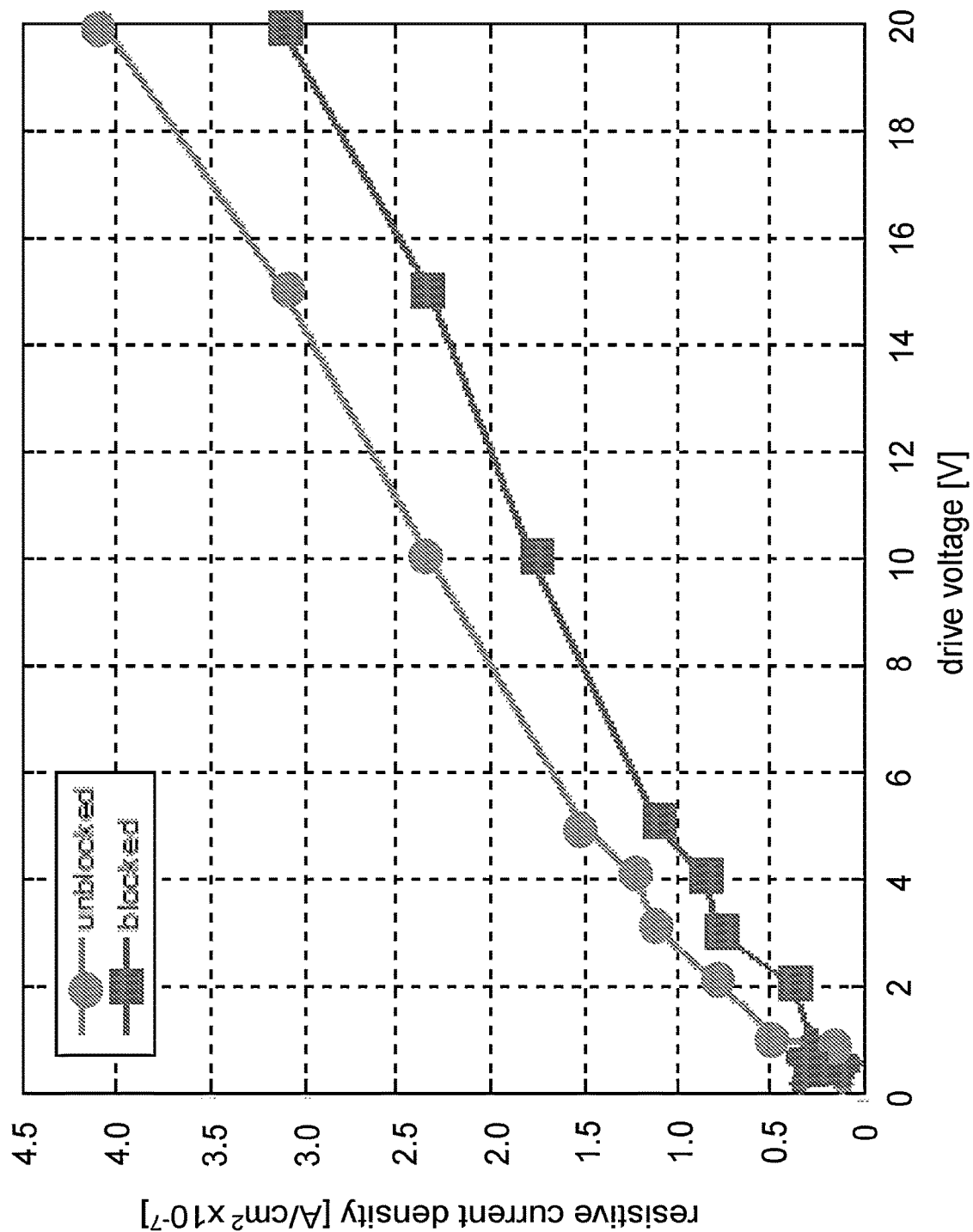
FIG. 12 shows measured resistive current density as a function of drive voltage in an electrophoretic display have a front electrode with (blocked) or without (unblocked) a dielectric layer.

Example 3—Reduction in Electrochemical Degradation in Electrophoretic Test Cells In addition to improving the response of the electrophoretic medium (above), the effect of an added dielectric layer on longevity of a test display was also evaluated. Two test displays of approximately 8" diagonal were prepared using the CMYW four particle electrophoretic medium of Example 2. The control used a standard active matrix TFT backplane, as found in a commercial eReader. In the other test display, the pixel electrodes were coated with 30 nm of tantalum oxide. The continuity of the tantalum oxide layer was not perfect, as shown in the graph of FIG. 12. If the tantalum oxide was without pinholes or defects, it would be expected that there would be considerably less resistive current density for the tantalum oxide "blocked" backplane. The displays were driven in a highly DC-imbalanced way using a sequence of (a) 30V for 3 seconds, followed by (b) grounding for 20 ms, then (c) floating for 6 seconds. This test cycle was repeated for several. Despite the shortcomings of the tantalum oxide coating, after 4 hours of driving, there was a noticeable difference in the "yellowing" of the white state in a test pattern when the displays were compared side-by-side. The difference in the amount of yellowing was more pronounced after an additional 4 hours of driving. Thus, in the presence of a highly DC-imbalance waveform, the display with the tantalum oxide coated backplane showed evidence of undergoing less electrochemistry.

Thus, a robust and non-reactive high-k dielectric layer can be formed. It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. An electrowetting on dielectric (EWoD) device having a plurality of active matrix electrodes disposed in an array where each electrode is associated with a thin film transistor (TFT), the device comprising:
   a layered dielectric stack comprising multiple metal oxide layers, wherein the layers include:
   a first layer of an aluminum oxide deposited by atomic layer deposition and having a thickness between 9 and 80 nm;
   a second layer of a hafnium oxide, the second layer having a thickness between 40 nm and 250 nm;

a third layer of a hafnium oxide deposited by atomic layer deposition, the third layer having a thickness between 10 nm and 35 nm, wherein the second layer is disposed between the first and third layers; and a hydrophobic layer deposited on the layered dielectric.

2. The device of claim 1, wherein the first layer has a thickness between 20 to 40 nm.

3. The device of claim 1, wherein the second layer has a thickness between 100 to 150 nm.

4. The device of claim 1, wherein the dielectric layer has a dielectric constant greater than 5.

5. The device of claim 1, wherein the electrowetting is performed with voltages in the range+/−10 to +/−50V.

6. The device of claim 1, wherein the hydrophobic layer comprises a fluoropolymer.

7. The device of claim 1, wherein the hydrophobic layer is between 10 and 50 nm thick.

8. The device of claim 1, wherein the dielectric strength of the layered dielectric is greater than 6 MV/cm.

9. The device of claim 1, wherein the thickness of the dielectric stack and hydrophobic layers is less than 600 nm.

10. The device of claim 1, wherein the thickness of the layered dielectric stack and hydrophobic layers is less than 300 nm.

11. A method of creating an electrowetting on dielectric (EWoD) device having a layered structure, the method comprising:

providing a substrate having a plurality of active matrix electrodes disposed in an array where each electrode is associated with a thin film transistor (TFT);

depositing a layered dielectric stack on the substrate by:
depositing a first layer of aluminum oxide using atomic layer deposition, the first layer having a thickness between 9 nm and 80 nm;
depositing a second layer of hafnium oxide, the second layer having a thickness between 40 nm and 250 nm; and
depositing a third layer of hafnium oxide using atomic layer deposition, the third layer having a thickness between 10 nm and 35 nm; and depositing a hydrophobic layer on the layered dielectric.

12. The method of claim 11, wherein the hydrophobic layer is coated onto the layered dielectric stack by spin coating.

13. The method of claim 11, wherein the first layer has a thickness between 20 to 40 nm.

14. The method of claim 11, wherein the second layer is 100 to 150 nm thick.

15. The method of claim 11, wherein the electrowetting is performed with voltages in the range+/−10 to +/−50V.

16. The method of claim 11, wherein the hydrophobic layer comprises a fluoropolymer.

17. The method of claim 11, wherein the hydrophobic layer is between 10 and 50 nm thick.

18. The method of claim 11, wherein the thickness of the layered dielectric stack and hydrophobic layers is less than 600 nm.

19. The method of claim 11, wherein the thickness of the layered dielectric stack and hydrophobic layers is less than 300 nm.

* * * * *